United States Patent
Park et al.

(10) Patent No.: US 11,038,382 B2
(45) Date of Patent: Jun. 15, 2021

(54) FOREIGN OBJECT DETECTING METHOD FOR WIRELESS CHARGING AND DEVICE THEREFOR

(71) Applicant: LG INNOTEK CO., LTD., Seoul (KR)

(72) Inventors: Jae Hee Park, Seoul (KR); Yong Il Kwon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/636,966

(22) PCT Filed: Jul. 30, 2018

(86) PCT No.: PCT/KR2018/008625
§ 371 (c)(1),
(2) Date: Feb. 6, 2020

(87) PCT Pub. No.: WO2019/031748
PCT Pub. Date: Feb. 14, 2019

(65) Prior Publication Data
US 2020/0259373 A1 Aug. 13, 2020

(30) Foreign Application Priority Data
Aug. 7, 2017 (KR) .......................... 10-2017-0099804

(51) Int. Cl.
*H02J 50/60* (2016.01)
*H02J 50/80* (2016.01)
(Continued)

(52) U.S. Cl.
CPC .............. *H02J 50/60* (2016.02); *G01R 23/02* (2013.01); *G01R 27/26* (2013.01); *G01V 3/081* (2013.01); *H02J 50/12* (2016.02); *H02J 50/80* (2016.02)

(58) Field of Classification Search
CPC ....................................................... H02J 50/60
(Continued)

(56) References Cited

U.S. PATENT DOCUMENTS

2013/0099592 A1 4/2013 Abe
2014/0015329 A1* 1/2014 Widmer ................. B60L 50/51
307/104
(Continued)

FOREIGN PATENT DOCUMENTS

JP 2014-220944 A 11/2014
KR 10-2015-0059069 A 5/2015
(Continued)

*Primary Examiner* — Joseph Chang
(74) *Attorney, Agent, or Firm* — Birch, Stewart, Kolasch & Birch LLP

(57) ABSTRACT

The present invention relates to a foreign object detecting method, and a device and system therefor. A method for detecting a foreign object in a wireless power transmitter according to an embodiment of the present invention may comprise the steps of: when an object placed in a charging area is sensed, measuring quality factor values within an operating frequency band to find a measured peak frequency at which the maximum quality factor value is measured; storing the measured peak frequency and the measured quality factor value corresponding to the measured peak frequency; transmitting information on the type of transmitter to an identified wireless power receiver; receiving a reference quality factor value and a reference peak frequency corresponding to the type of transmitter; calculating a measured inductance by using the measured peak frequency; calculating a reference inductance by using the reference peak frequency; and detecting a foreign object by using at least one of the reference quality factor value, the reference peak frequency, and the reference inductance.

12 Claims, 31 Drawing Sheets

(51) Int. Cl.
  *H02J 50/12* (2016.01)
  *G01R 23/02* (2006.01)
  *G01R 27/26* (2006.01)
  *G01V 3/08* (2006.01)
(58) Field of Classification Search
  USPC .......................................................... 307/104
  See application file for complete search history.

(56) References Cited

U.S. PATENT DOCUMENTS

| | | |
|---|---|---|
| 2014/0084857 A1 | 3/2014 | Liu et al. |
| 2014/0111019 A1* | 4/2014 | Roy ................ H01F 38/14 307/104 |
| 2014/0337643 A1 | 11/2014 | Tsukamoto |
| 2016/0141882 A1 | 5/2016 | Ichikawa |
| 2016/0241086 A1 | 8/2016 | Jung et al. |
| 2019/0319494 A1* | 10/2019 | Park ................ H02J 50/60 |

FOREIGN PATENT DOCUMENTS

| | | |
|---|---|---|
| KR | 10-2016-0022823 A | 3/2016 |
| WO | WO 2012/002063 A1 | 1/2012 |

* cited by examiner

[FIG. 1]
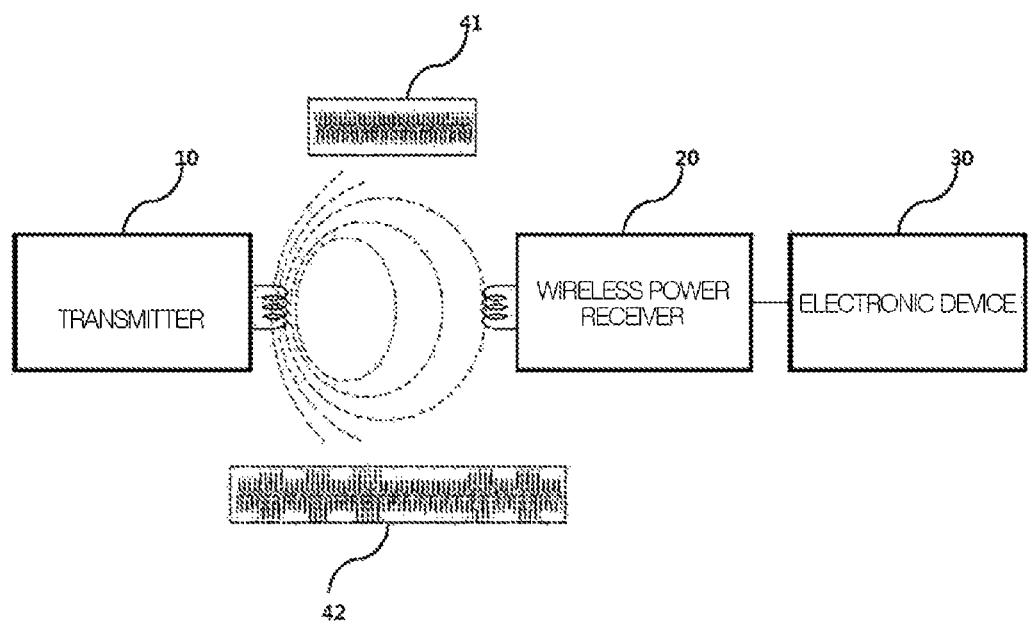

[FIG. 2]
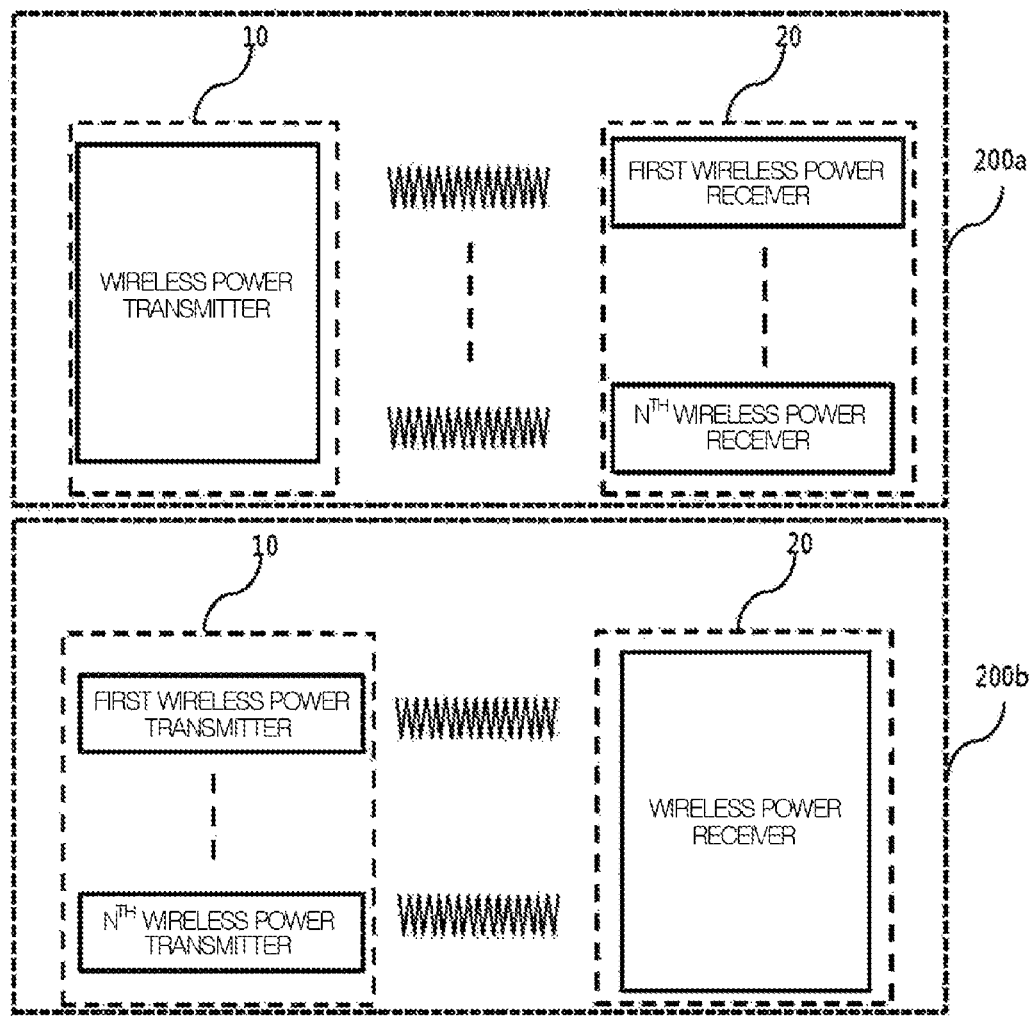

[FIG. 3]
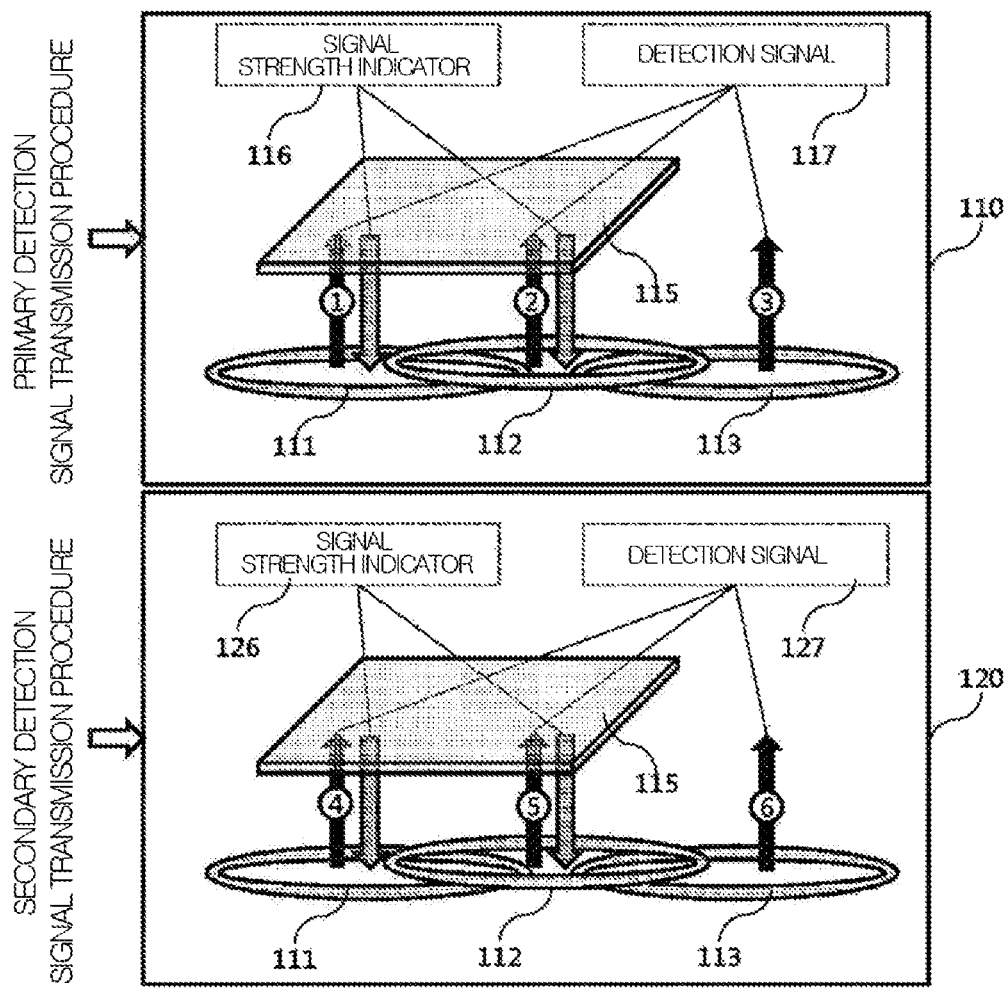

[FIG. 4]
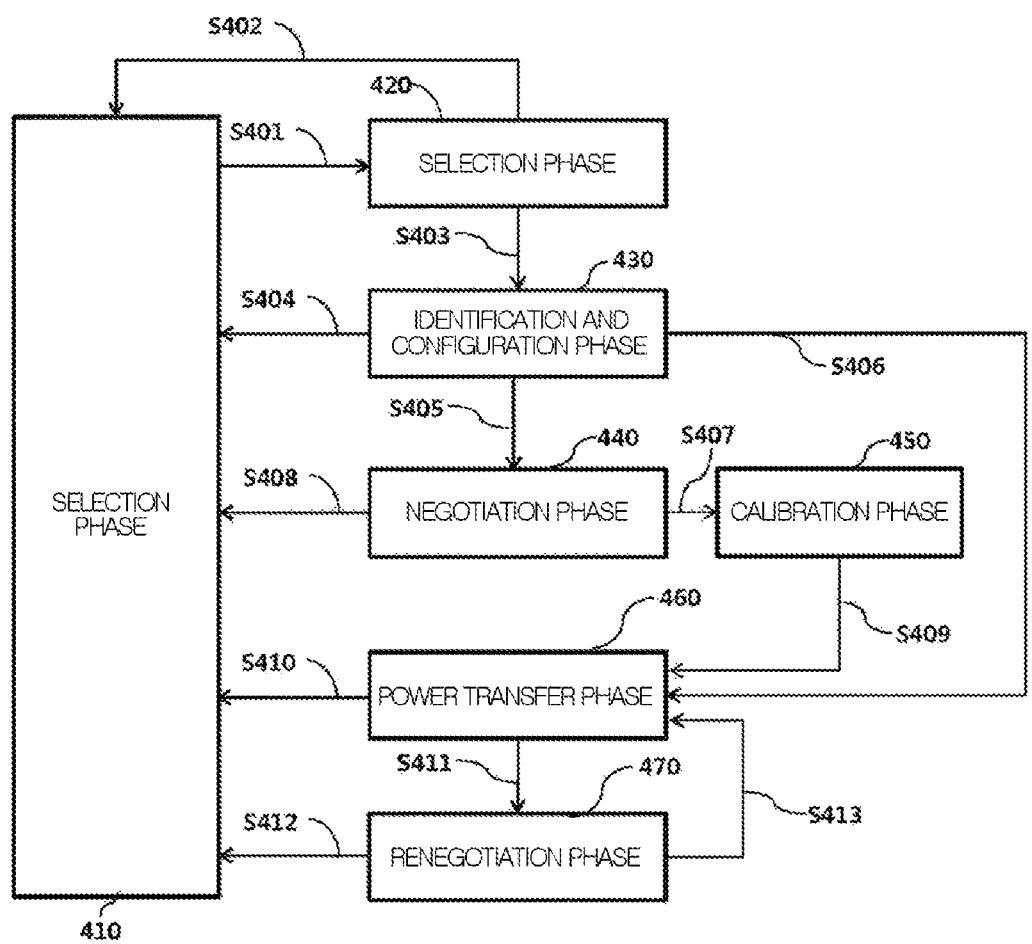

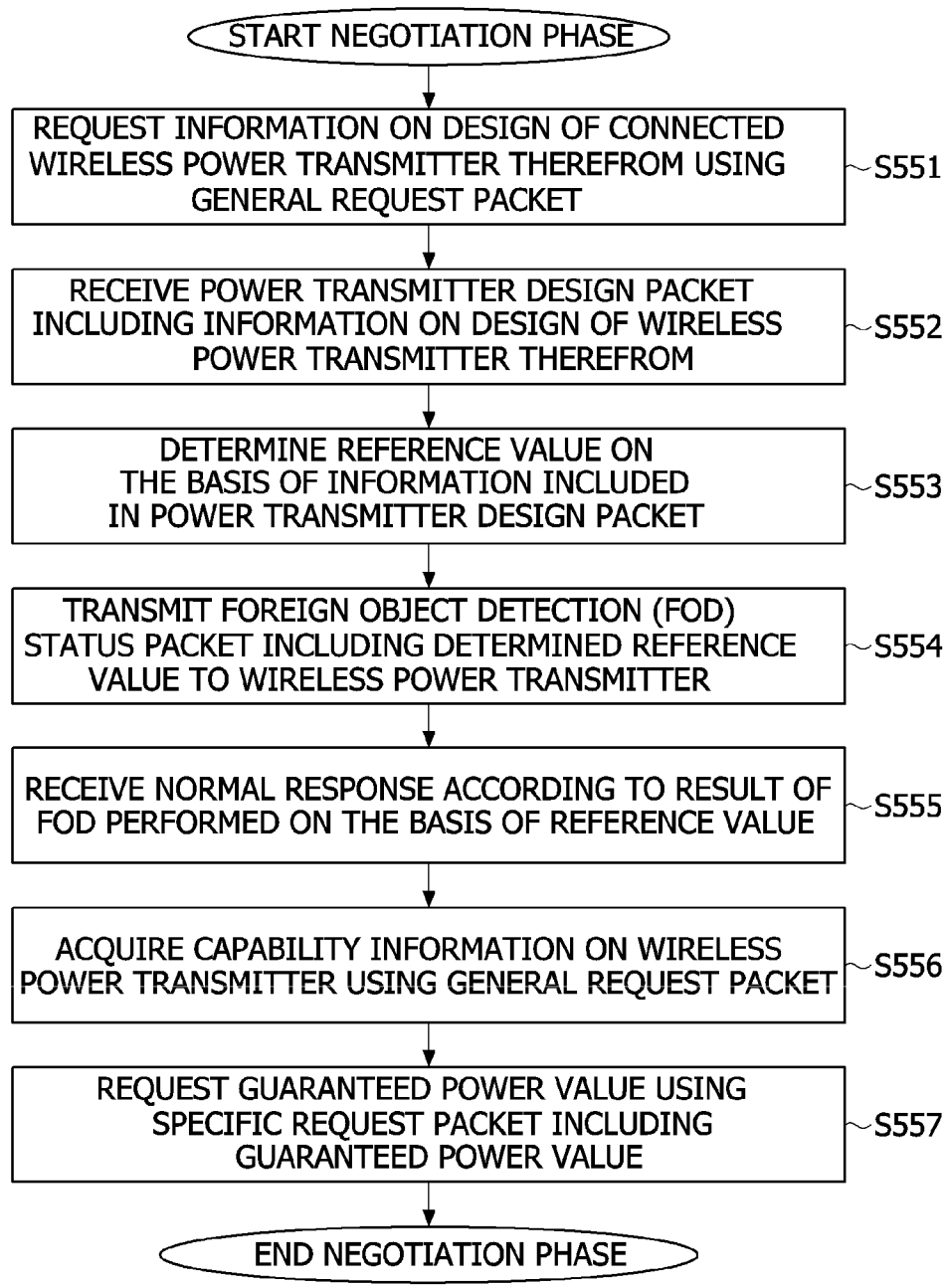
[FIG. 5A]

[FIG. 5B]
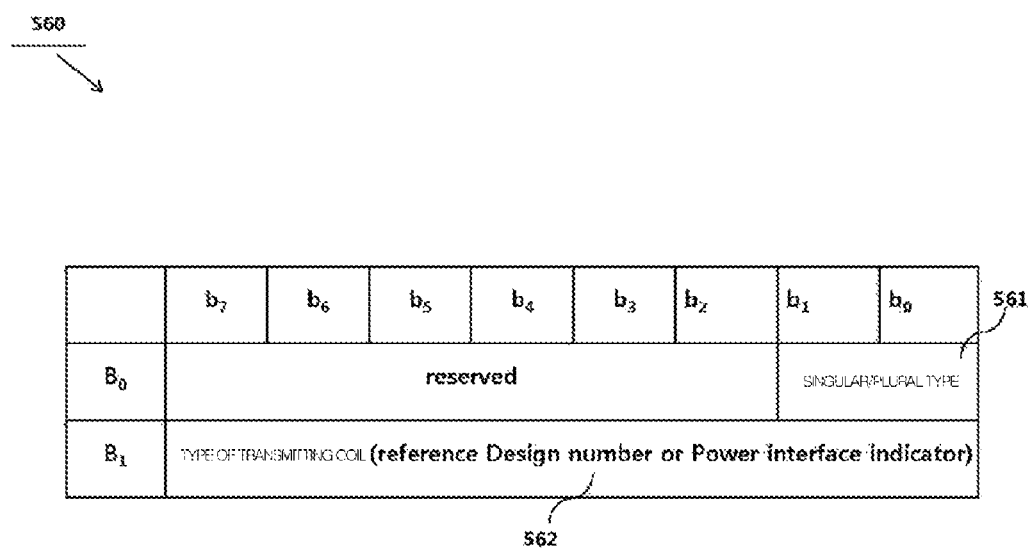

[FIG. 5C]
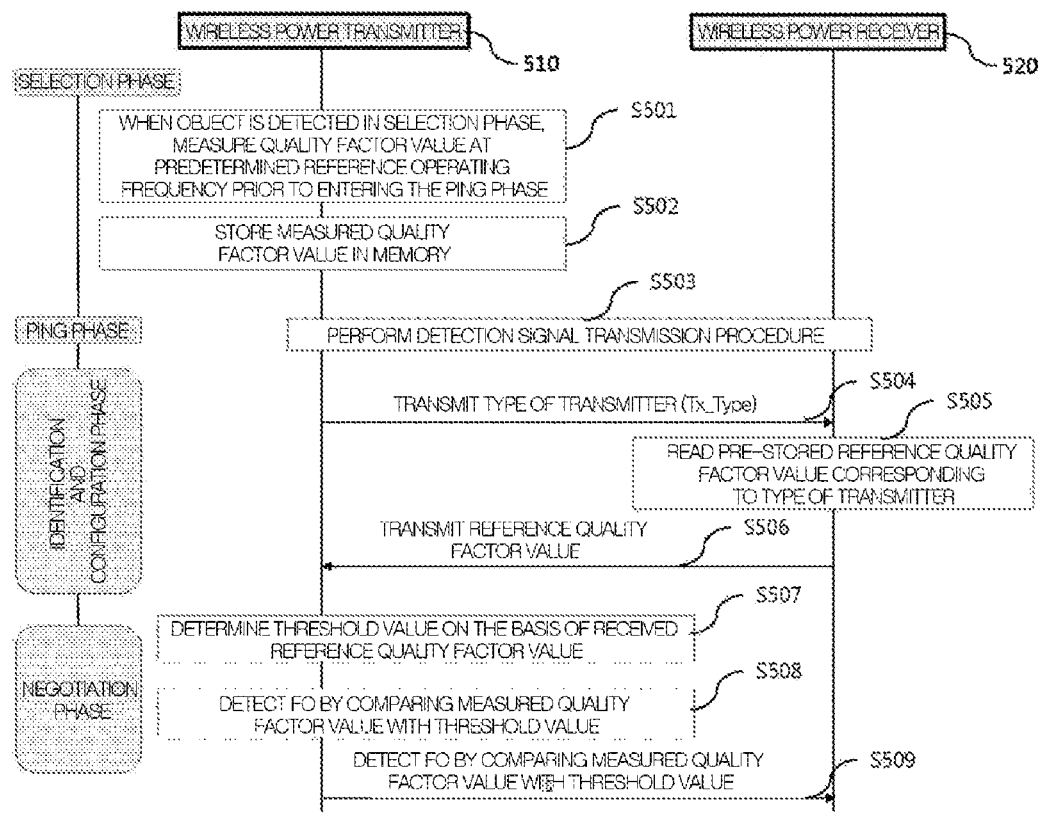

[FIG. 6]
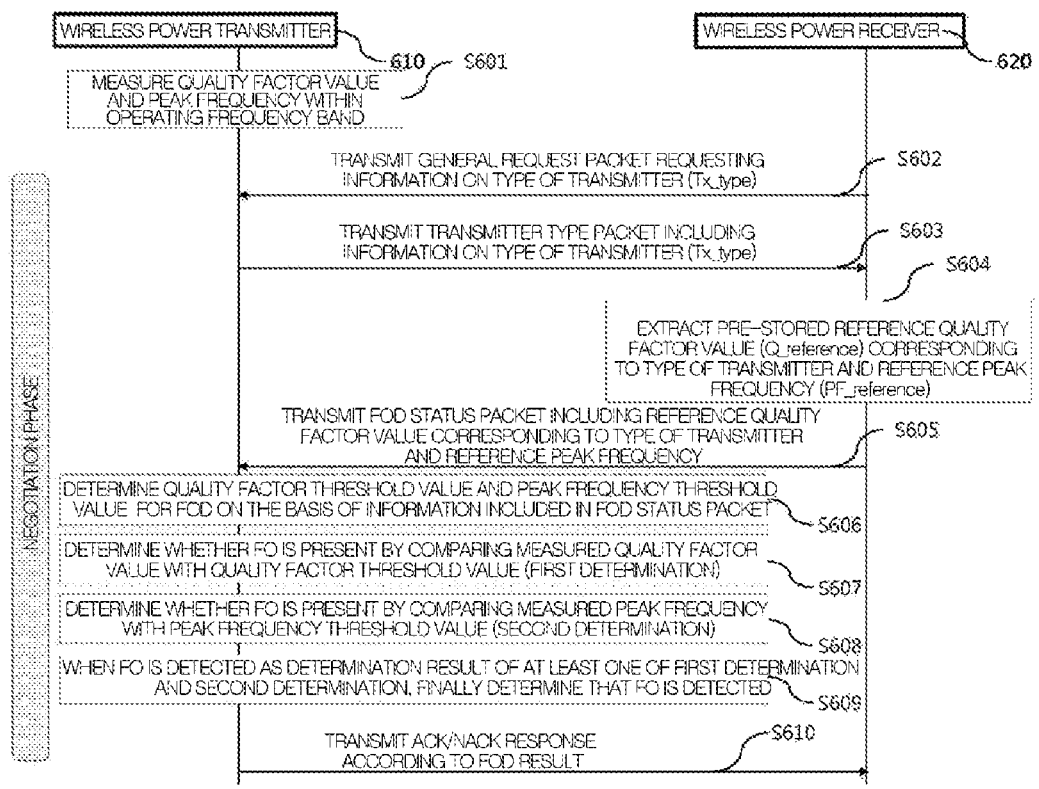

[FIG. 7]
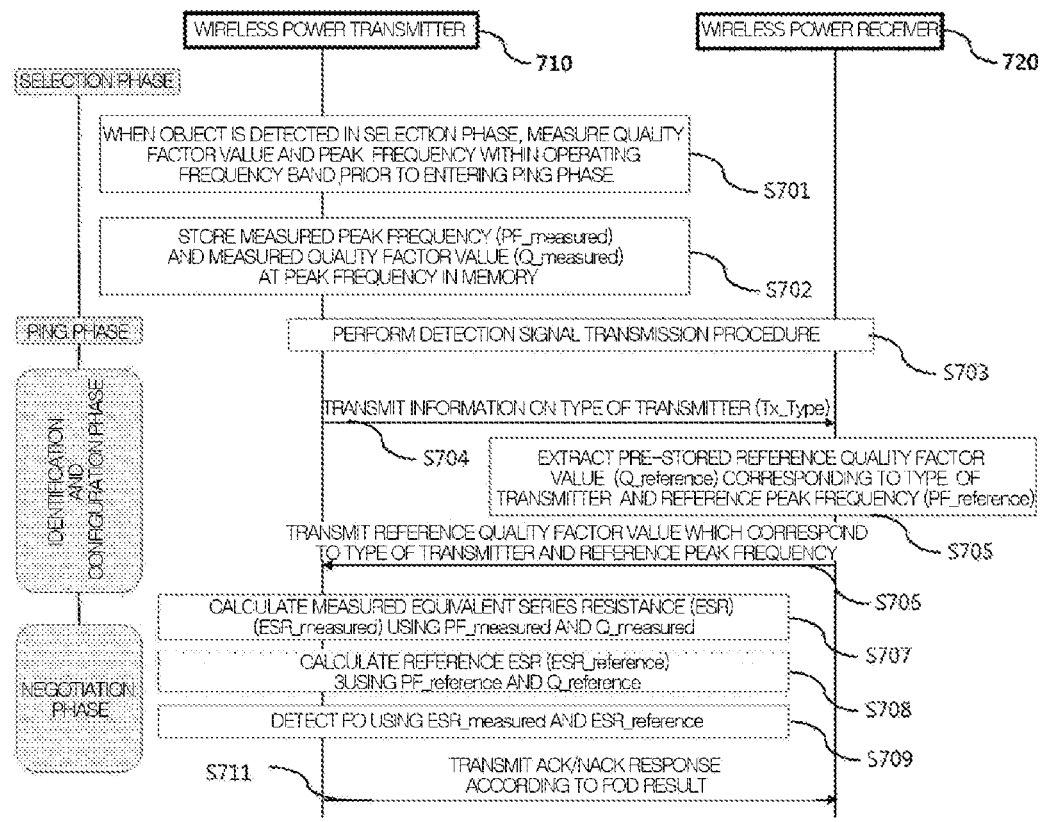

[FIG. 8]
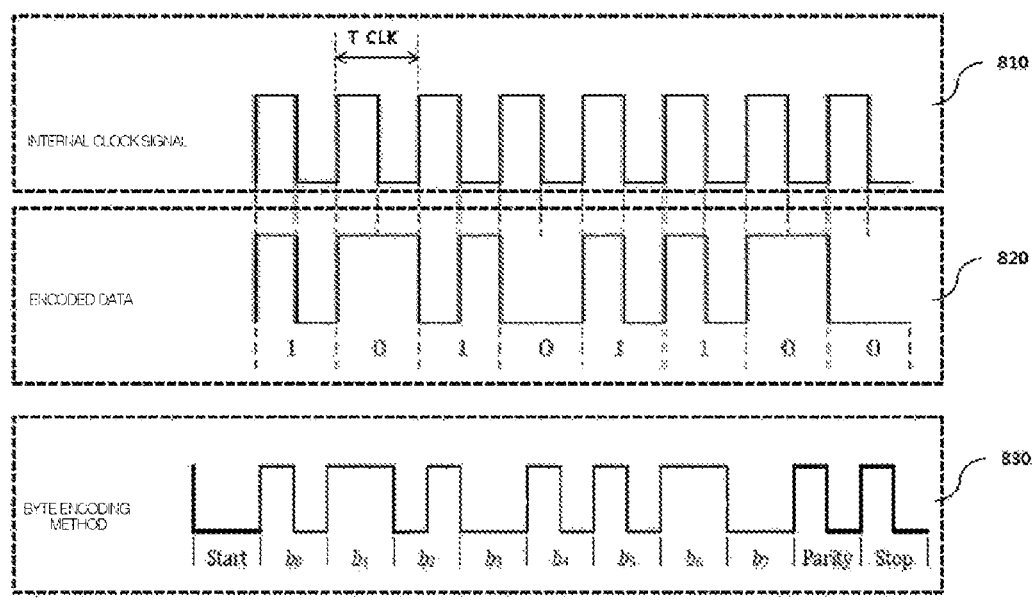

[FIG. 9]
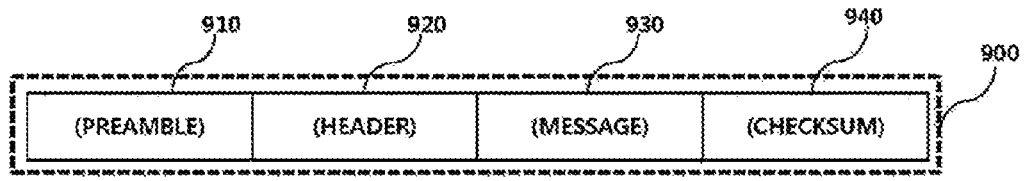

[FIG. 10]

| HEADER | PACKET TYPE | MESSAGE SIZE (BYTE) |
|---|---|---|
| 0x01 | (Signal Strength) | 1 |
| 0x02 | (End Power Transfer) | 1 |
| 0x06 | (Power Control Hold-off) | 1 |
| 0x51 | (Configuration) | 5 |
| 0x71 | (Identification) | 7 |
| 0x81 | (Extended Identification) | 8 |
| 0x07 | (General Request) | 1 |
| 0x20 | (Specific Request) | 2 |
| 0x22 | (FOD Status) | 2 |
| 0x32 | (Extended FOD Status) | 3 |
| 0x03 | (Control Error) | 1 |
| 0x09 | (Renegotiate) | 1 |
| 0x31 | (24-bit Received Power) | 3 |
| 0x04 | (8-bit Received Power) | 1 |
| 0x05 | (Charge Status) | 1 |

— 1010

| HEADER | PACKET TYPE | MESSAGE SIZE (BYTE) |
|---|---|---|
| 0x2F | (Power Transmitter Design) | 2 |
| 0x32 | TYPE OF TRANSMITTER (Tx Type) | 2 |

— 1020

[FIG. 11]
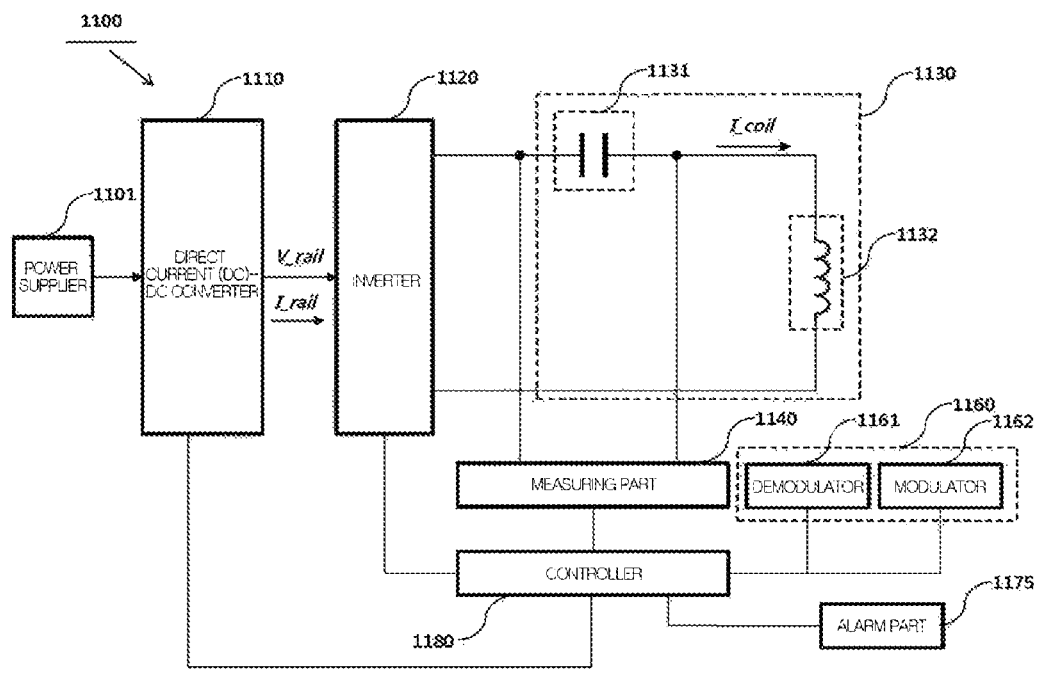

[FIG. 12]
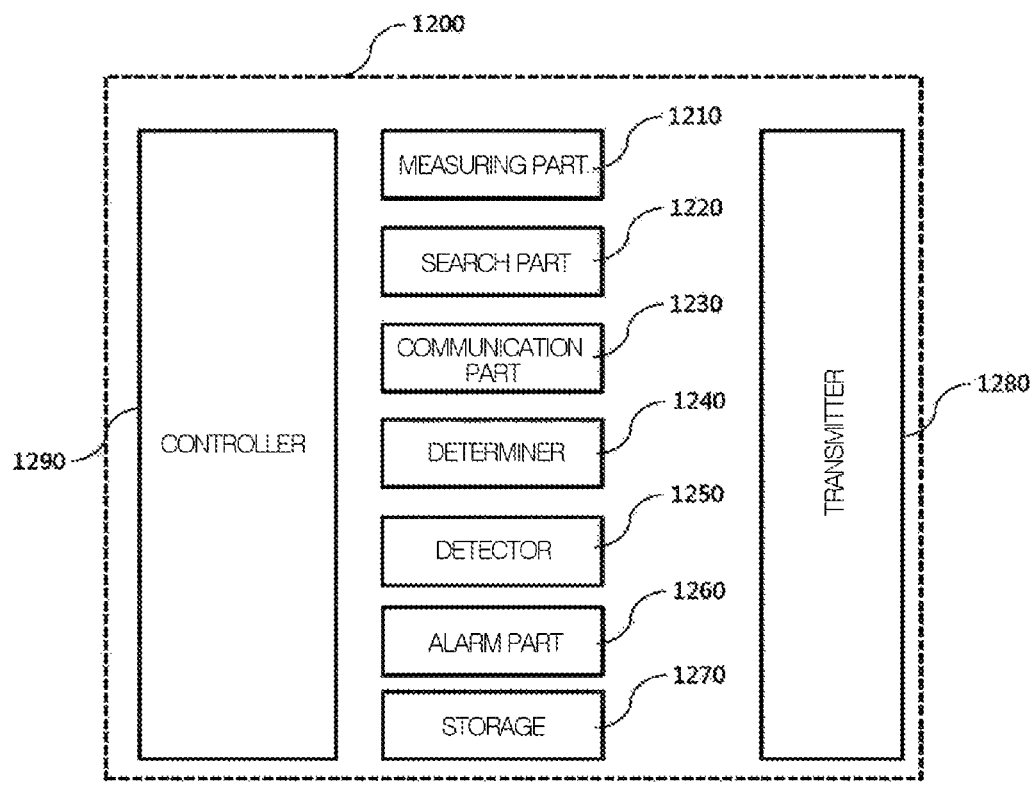

[FIG. 13]
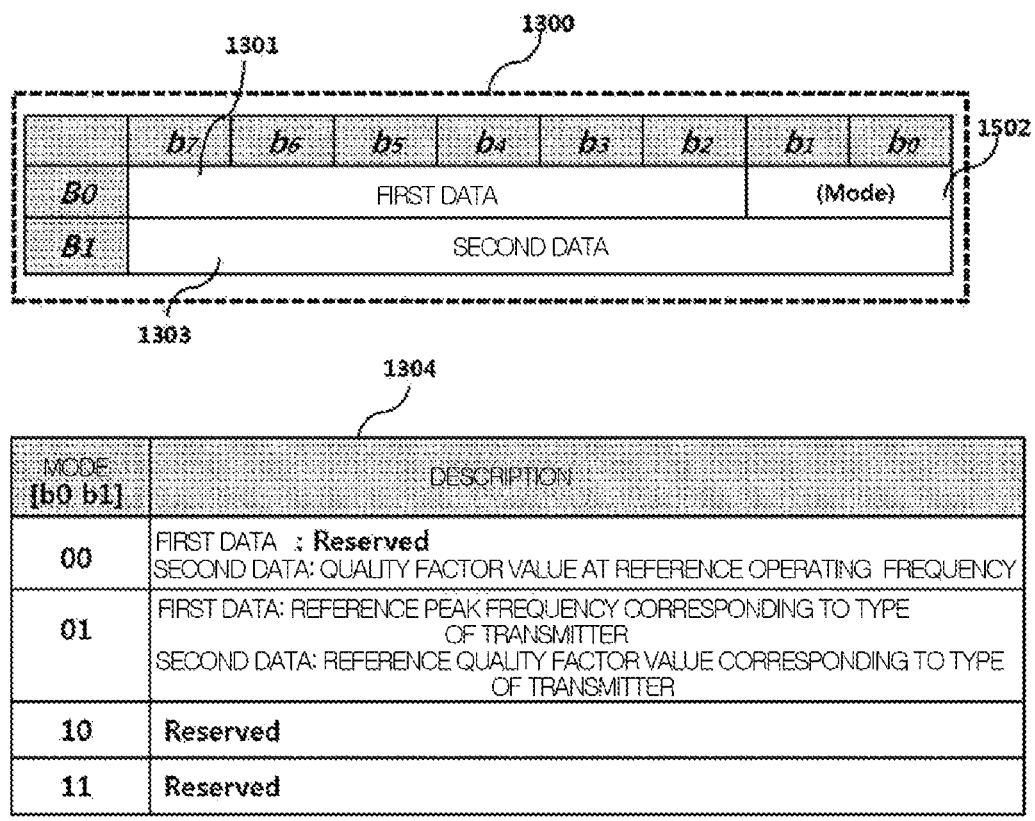

[FIG. 14A]
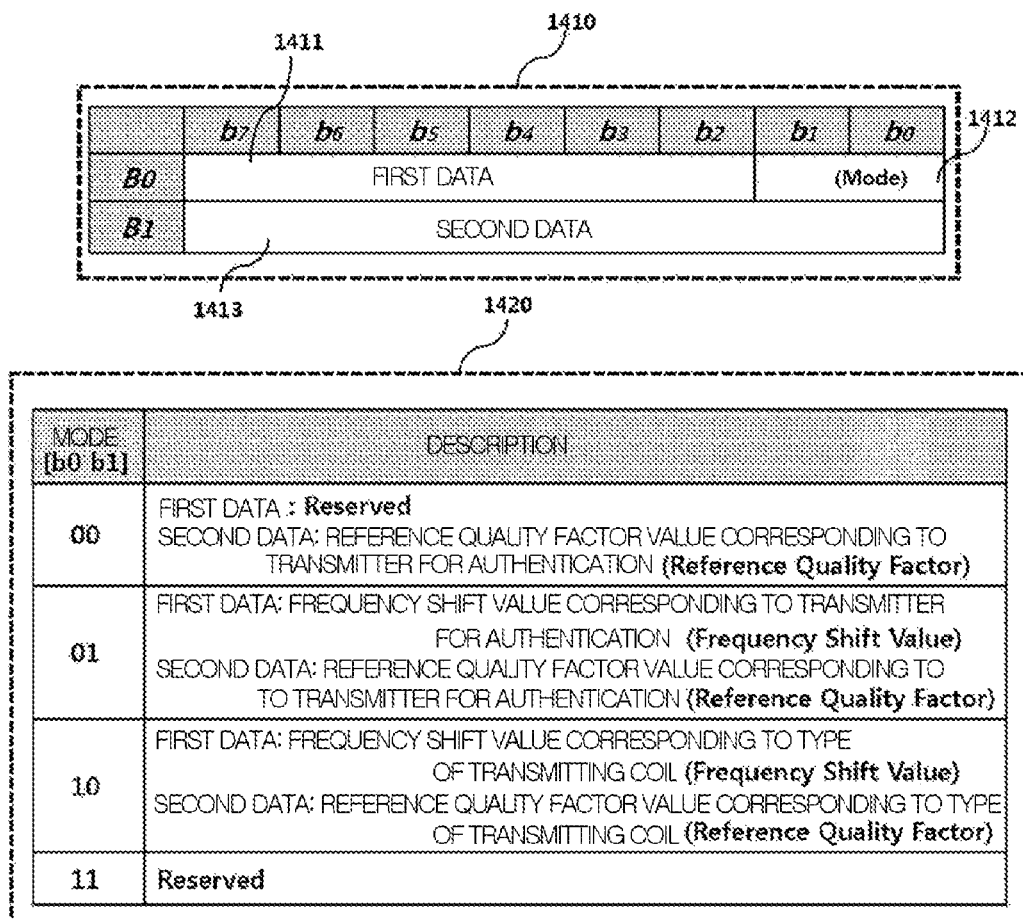

[FIG. 14B]
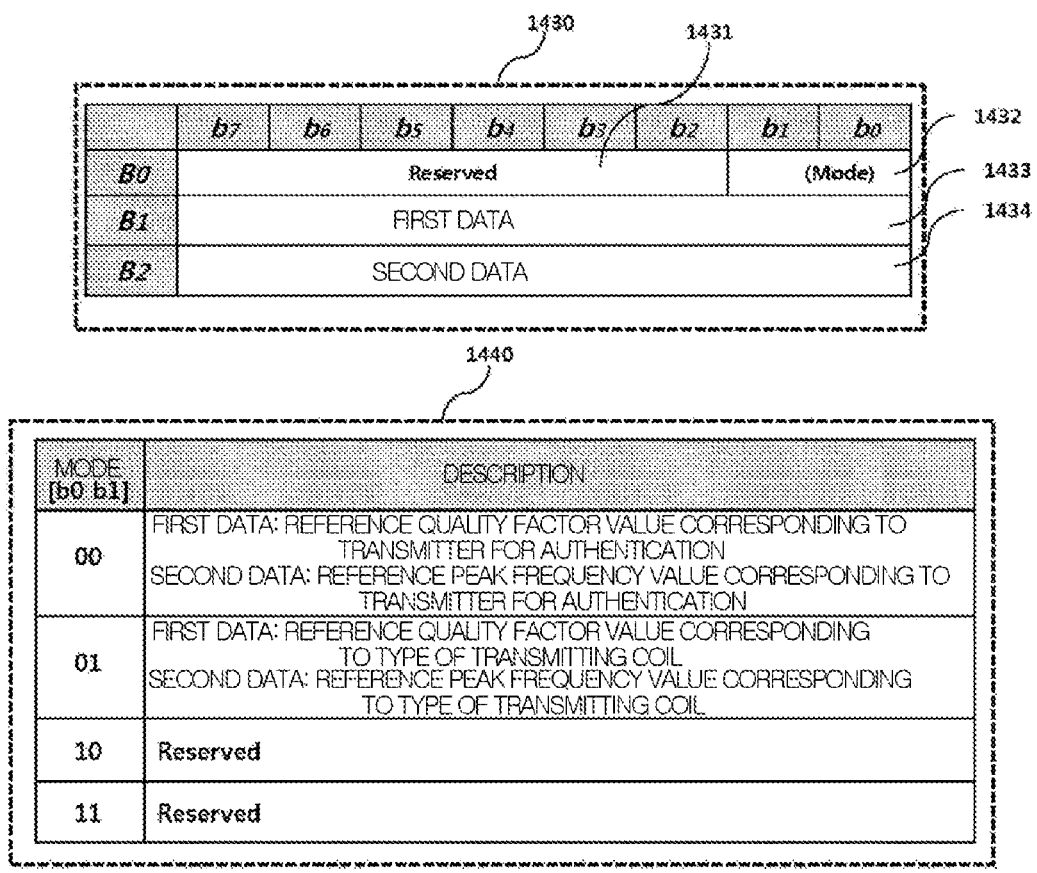

[FIG. 15]
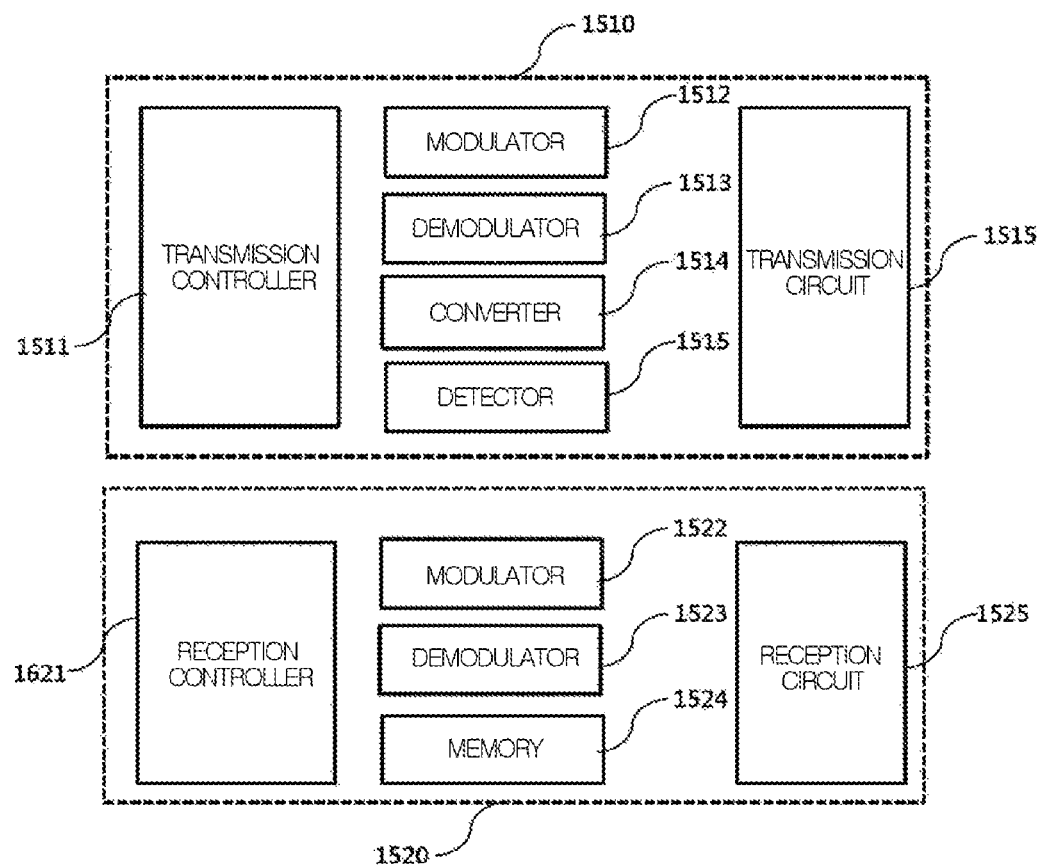

[FIG. 16]
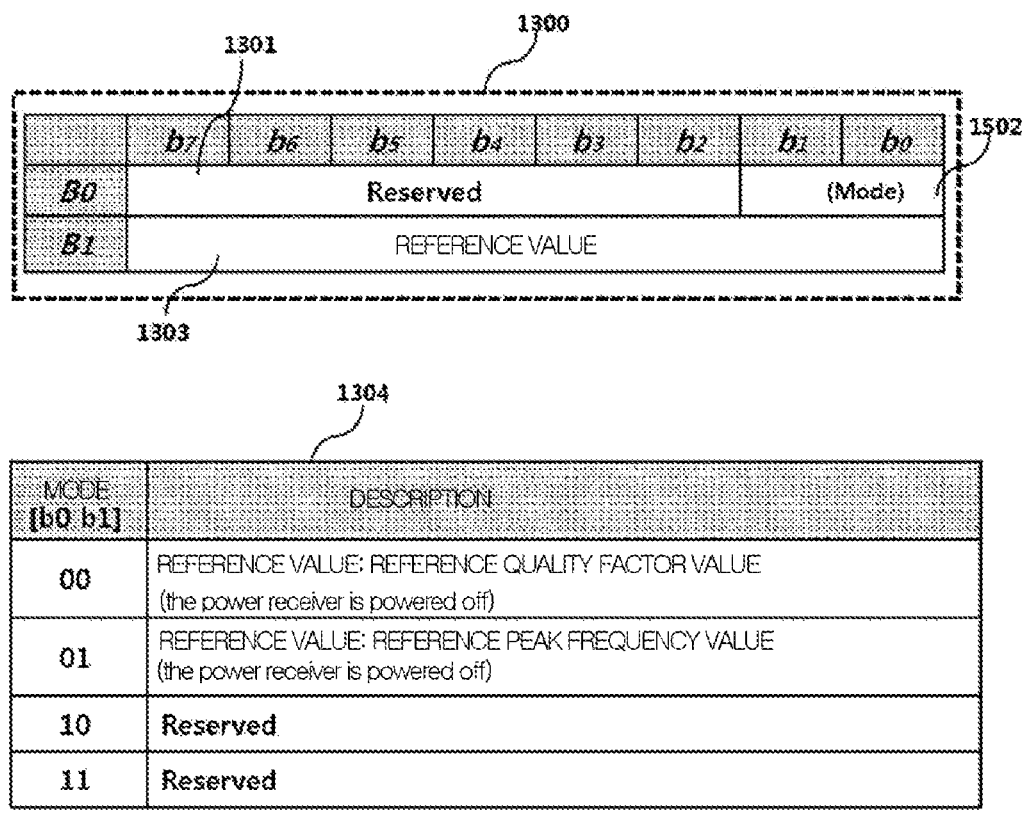

[FIG. 17A]
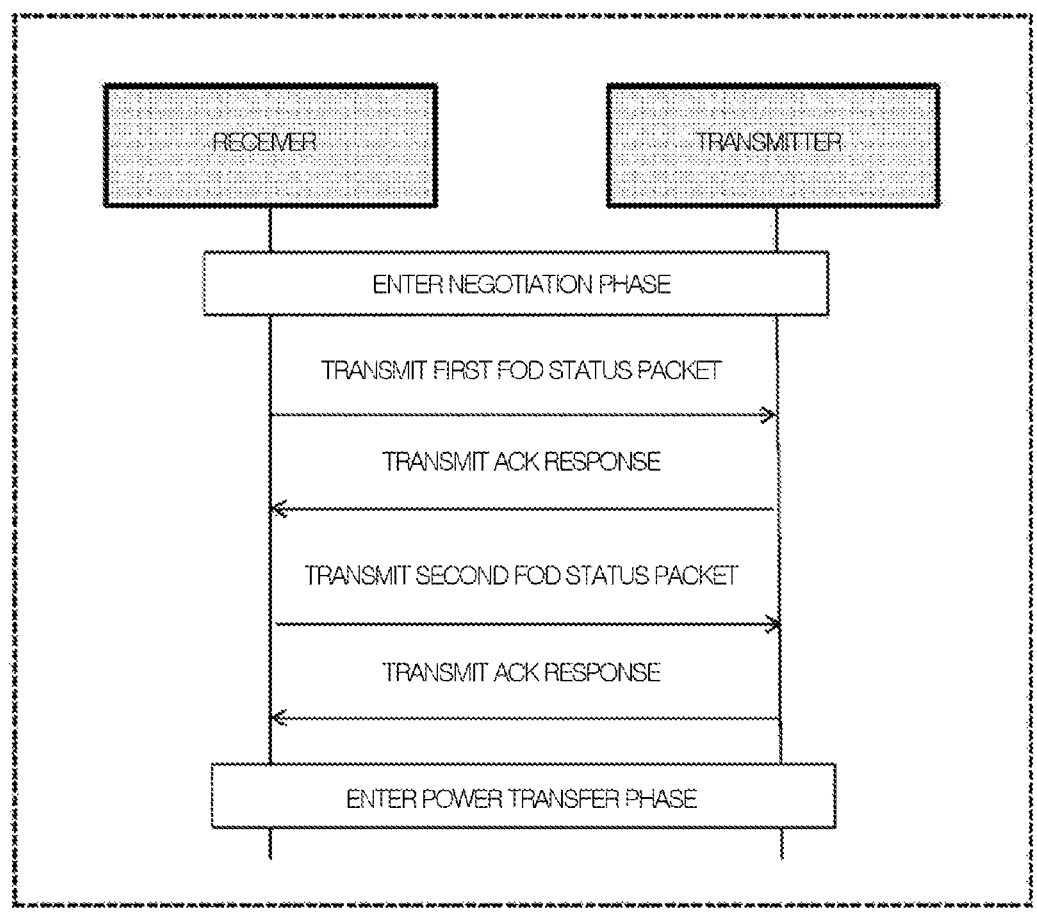

[FIG. 17B]
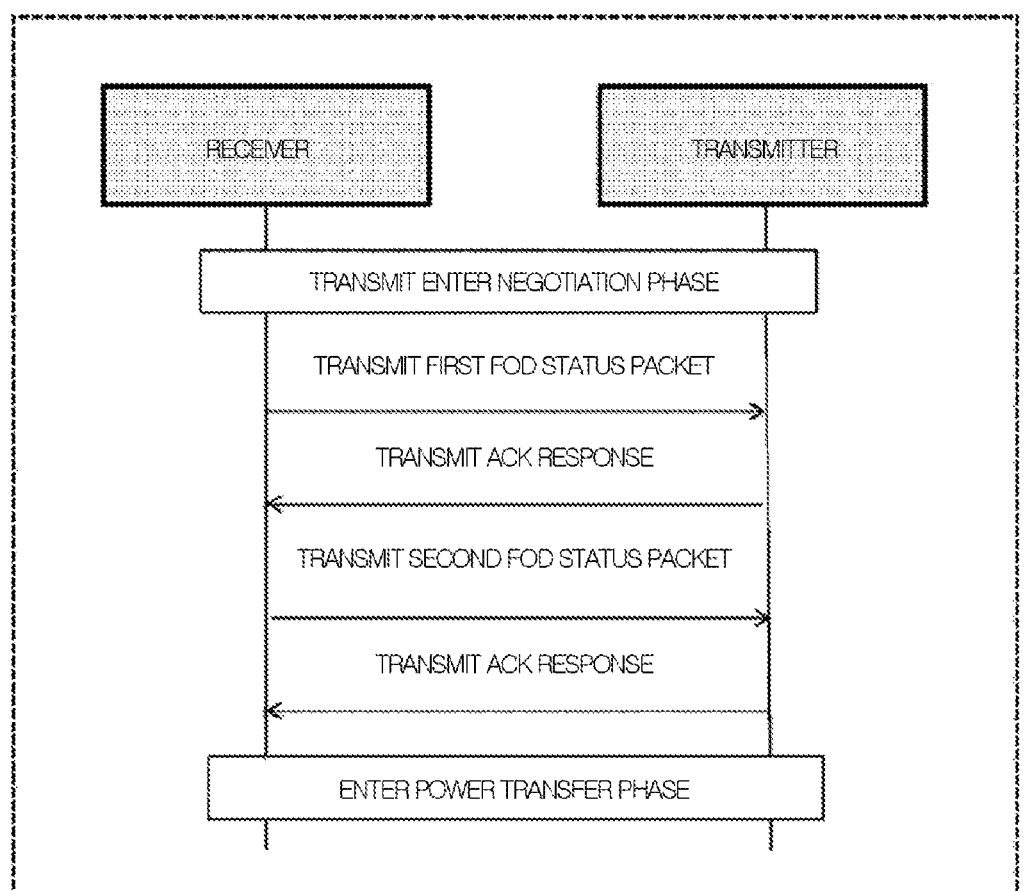

[FIG. 17C]
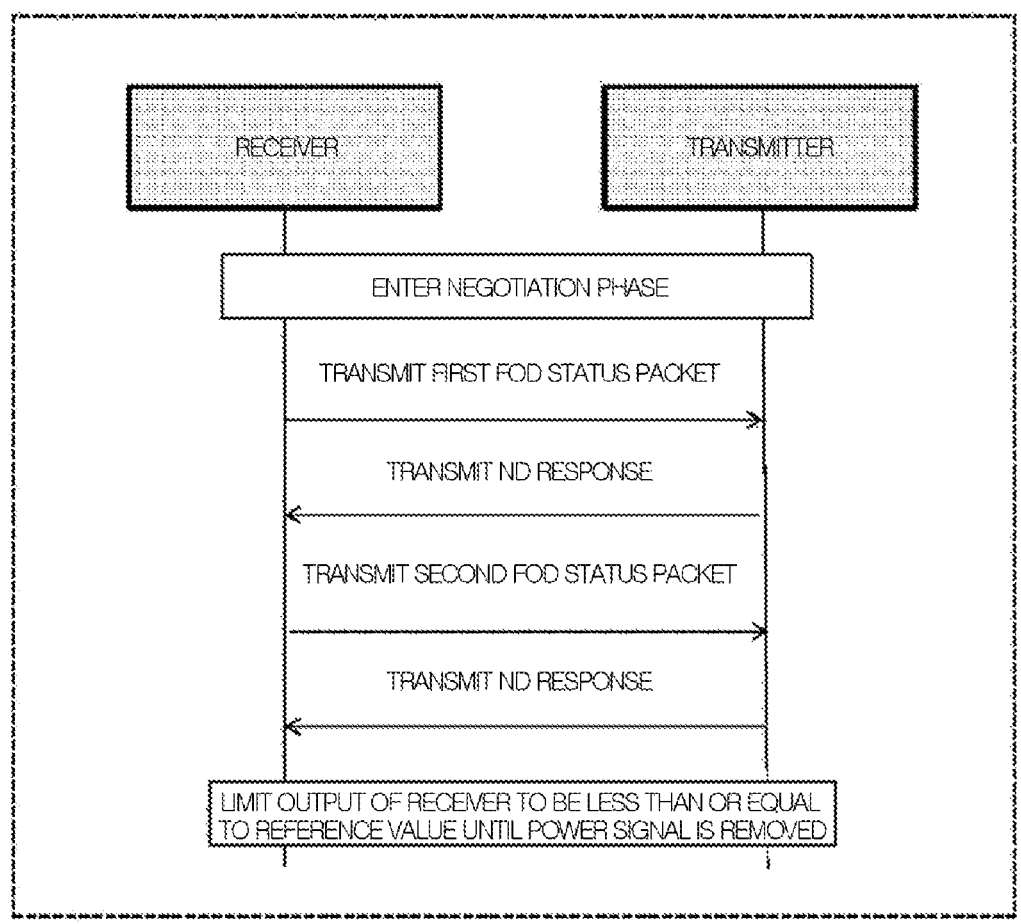

[FIG. 17D]
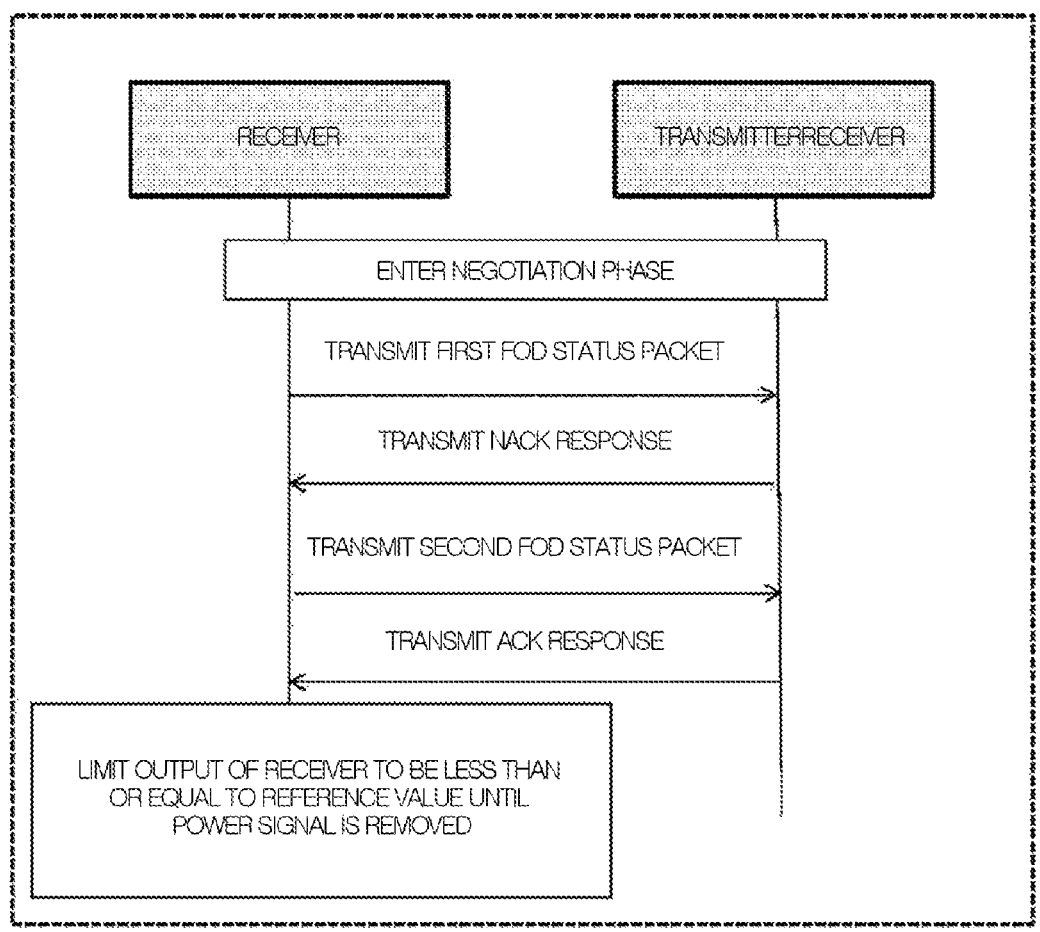

[FIG. 17E]
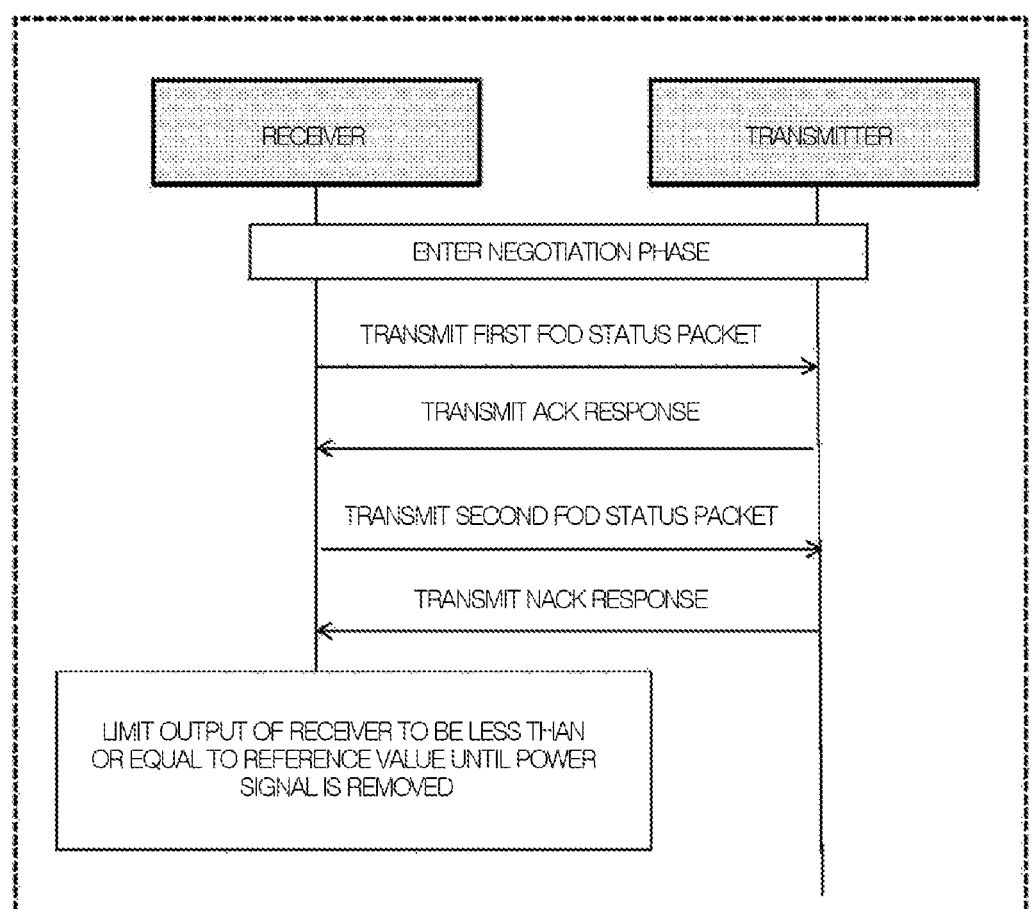

[FIG. 17F]
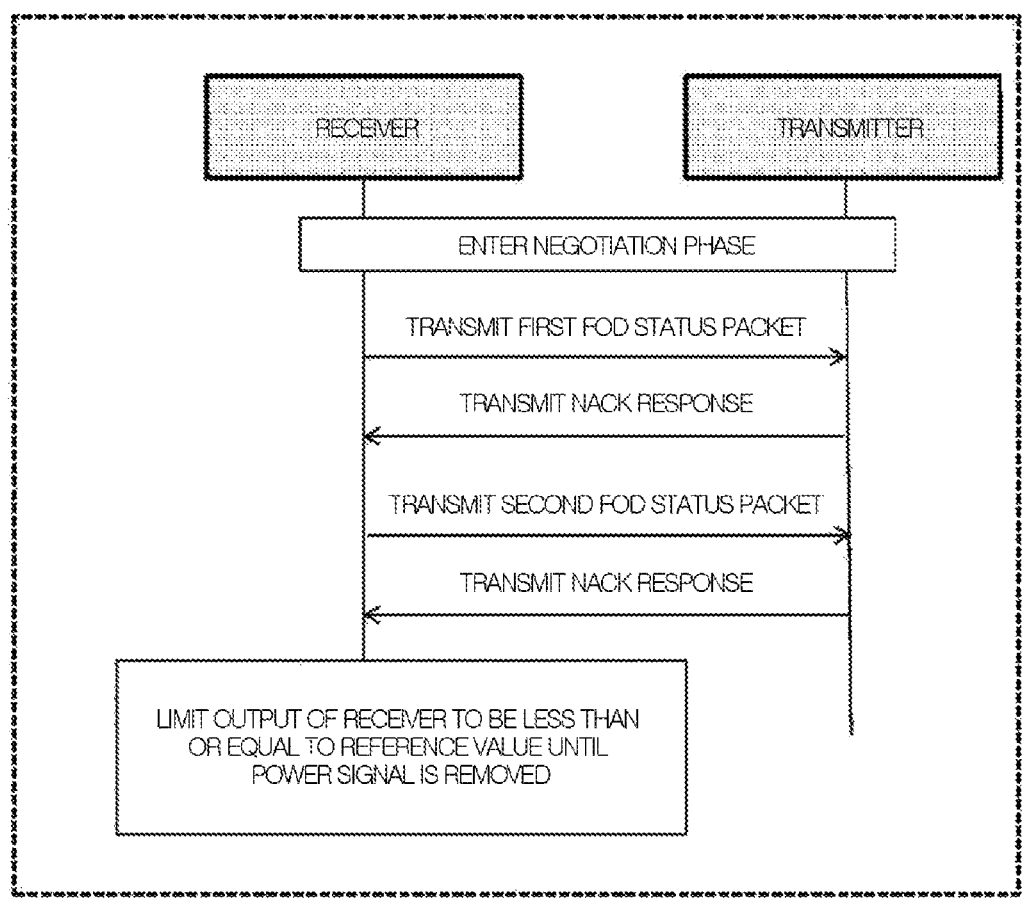

[FIG. 17G]
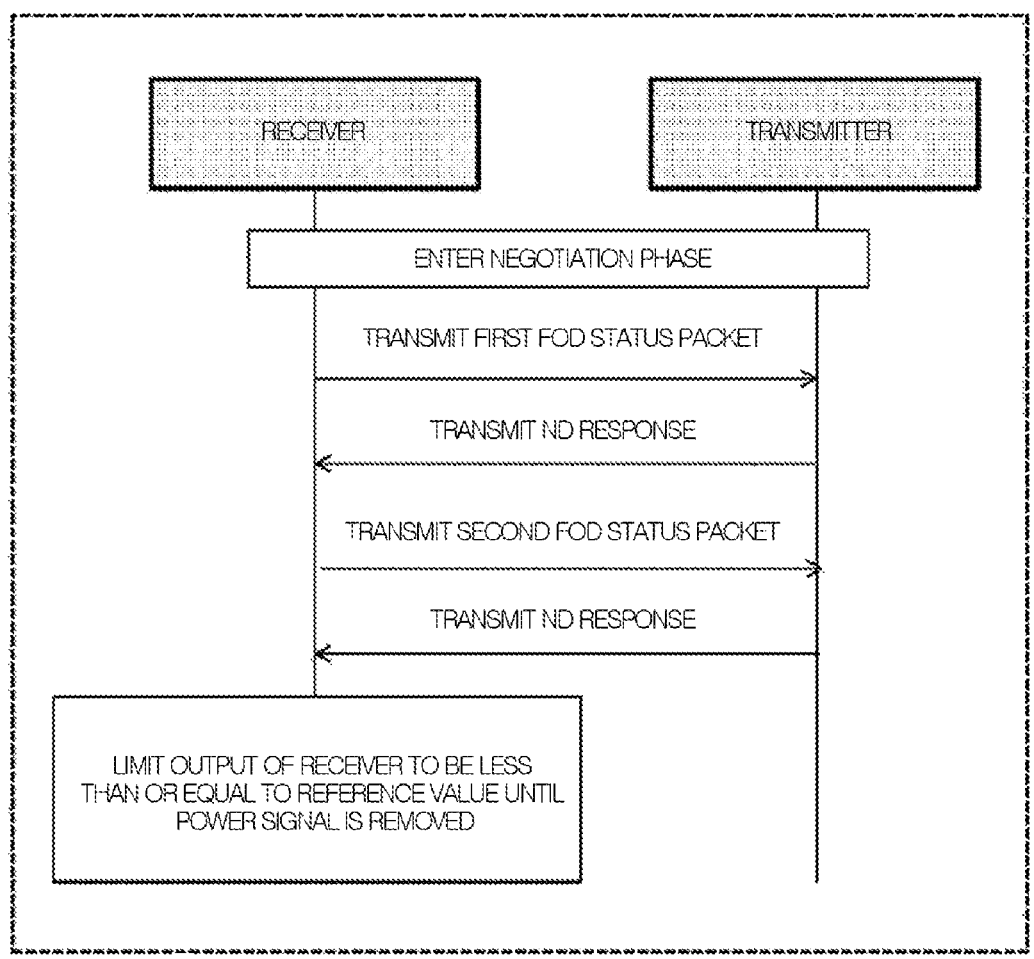

[FIG. 17H]
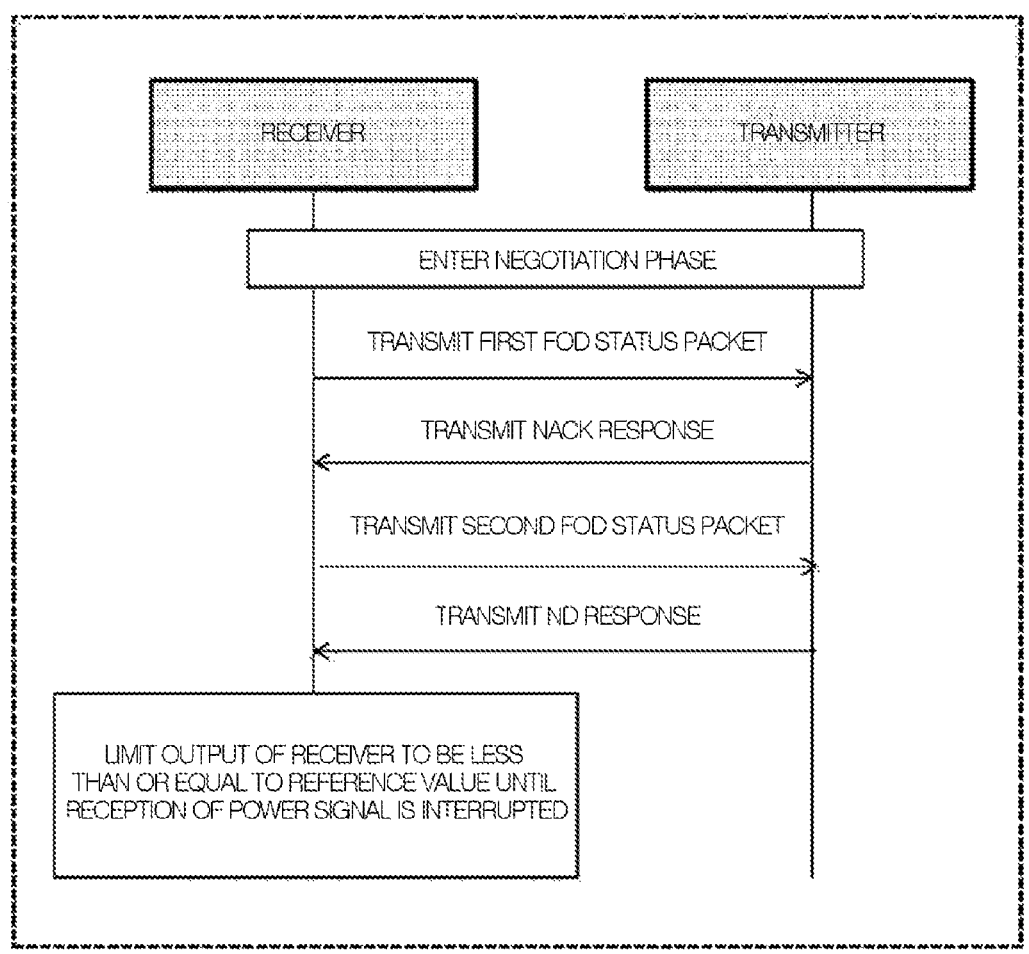

[FIG. 17I]
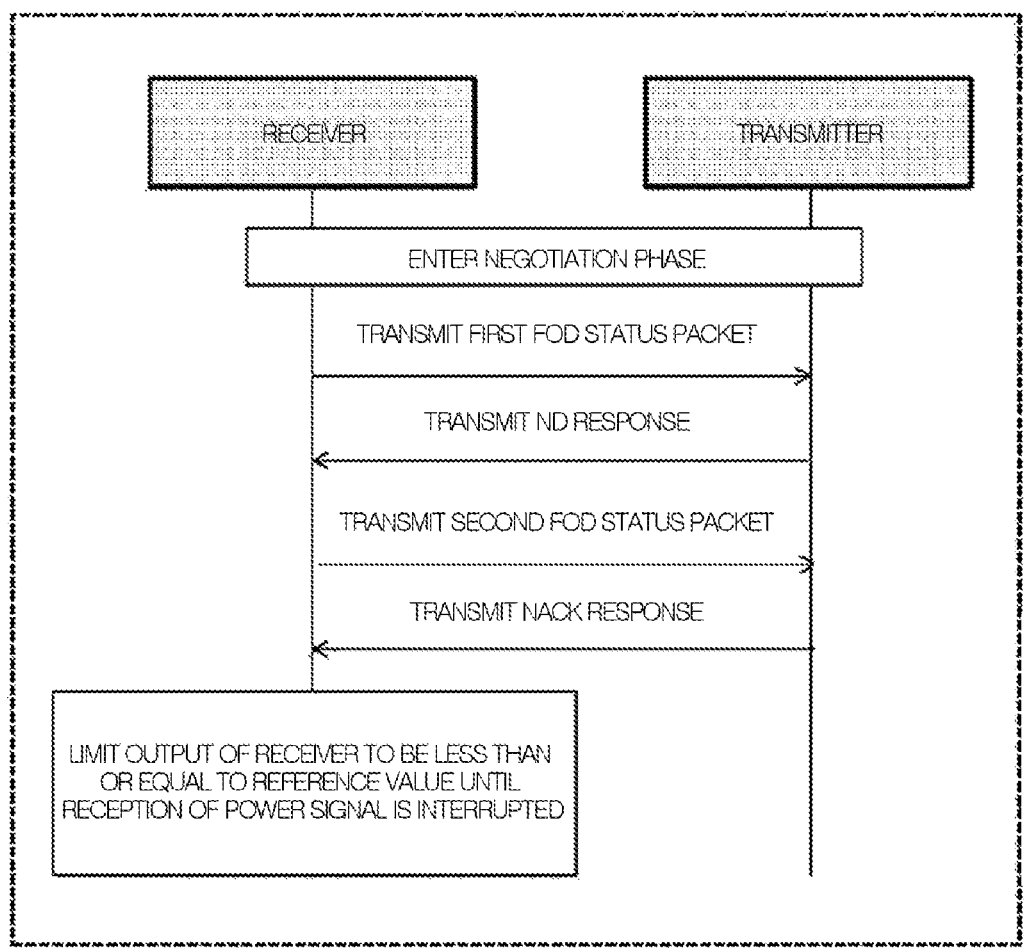

[FIG. 18]
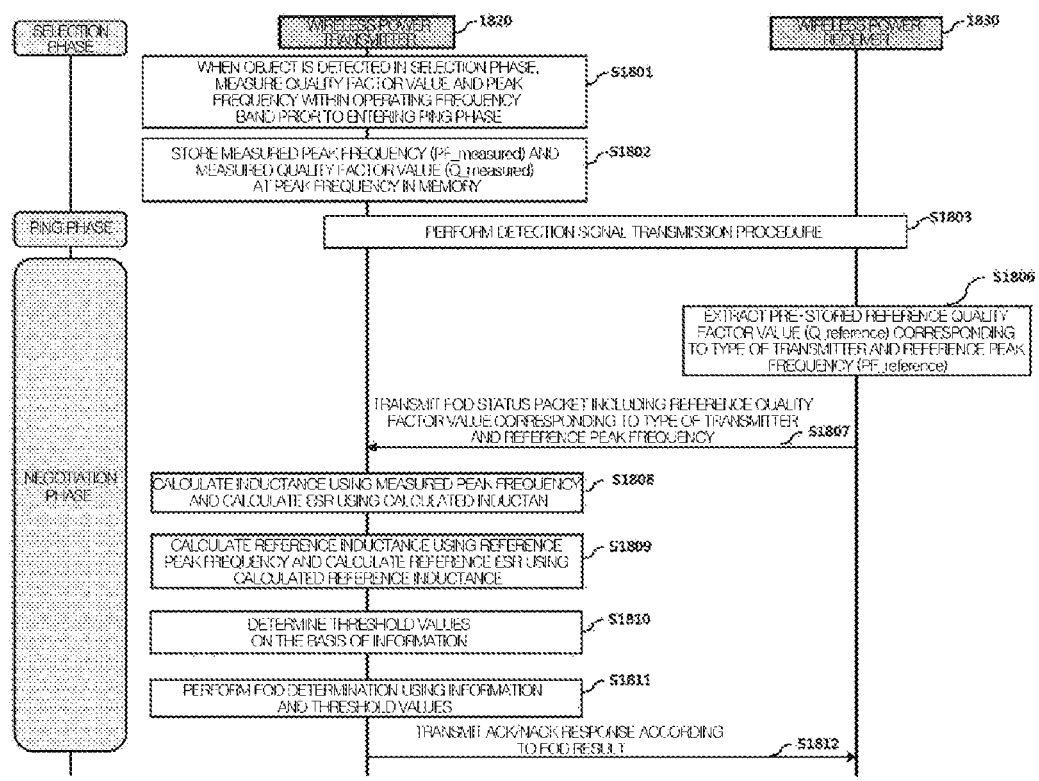

[FIG. 19]
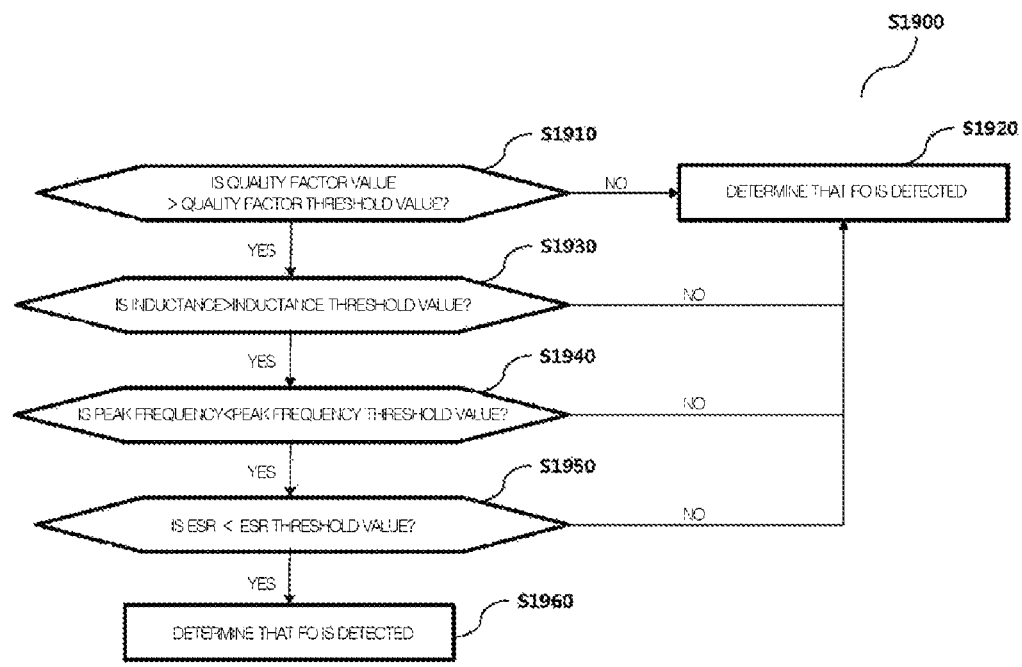

[FIG. 20]

| TRANSMITTER | RECEIVER | QUALITY FACTOR VALUE | PF(Khz) | ESR(mOhms) | Lp'(μH) |
|---|---|---|---|---|---|
| LCR METER MEASUREMENT OF TYPE-1 COIL | Mobile Device 1(MD1) | 40.83 | 85 | 552 | 35.86 |
| THERSHOLD VALUE | MD1 | 36.729 | 90 | 100 | 10.2 |
| TYPE-4 COIL WIRELESS POWER TRANSMITTER | MD1 | 68 | 84.8 | 100 | 12.78 |
| | MD1+Cover(1mm) | 71 | 90.4 | 90 | 11.24 |
| | MD1+Cover(2mm) | 83 | 92.7 | 75 | 10.69 |
| | MD1+FO(center) | 35 | 104.4 | 143.5 | 8.4 |
| | MD1+FO(10mm) | 55 | 99.3 | 106 | 9.32 |
| | MD1+Cover(1mm)+FO(center) | 41 | 106 | 132.8 | 8.18 |
| | MD1+Cover(2mm)+FO(center) | 46 | 108.1 | 116 | 7.86 |
| | MD1+Cover(1mm)+FO(10mm) | 54 | 102.4 | 108.3 | 8.78 |
| | MD1+Cover(2mm)+FO(10mm) | 62 | 104.4 | 89.1 | 8.43 |

DETECTION OF FO

FOREIGN OBJECT DETECTING METHOD FOR WIRELESS CHARGING AND DEVICE THEREFOR

CROSS REFERENCE TO RELATED APPLICATIONS

This application is the National Phase of PCT/KR2018/008625 filed on Jul. 30, 2018, which claims priority under 35 U.S.C. § 119(a) to Patent Application No. 10-2017-0099804 filed in the Republic of Korea on Aug. 7, 2017, all of which are hereby expressly incorporated by reference into the present application.

TECHNICAL FIELD

The present invention relates to a wireless power transmission technique, and more particularly, to a method of detecting a foreign object disposed in a charging area of a wireless power transmitter, and a device therefor.

BACKGROUND ART

Recently, with the rapid development of information and communication technology, a ubiquitous society based on the information and communication technology is being made.

In order for information communication devices to be connected anytime and anywhere, sensors in which computer chips having communication functions are embedded should be installed in all facilities in society. Therefore, a problem of supplying power to these devices and sensors is becoming a new problem.

Further, as types of mobile devices including mobile phones, Bluetooth handsets, and music players such as iPods have increased rapidly, charging a battery requires time and effort of users. Recently, wireless power transmission technology has received attention as a method of solving the above problems.

The wireless power transmission (or wireless energy transfer) technology is a technology that transmits electrical energy from a transmitter to a receiver in a wireless manner using the principle of magnetic field induction. In the 1800's, electric motors or transformers using the principle of electromagnetic induction began to be used. After that, a method of transmitting electric energy by radiating electromagnetic waves such as high frequencies, microwaves, and lasers has been attempted.

Electric toothbrushes and some wireless razors, which are commonly used, are actually charged according to the principle of electromagnetic induction.

Until the present, an energy transmission method using a wireless manner may be classified into a magnetic induction method, an electromagnetic resonance method, and a radio frequency (RF) transmission method using a short-wave radio frequency.

The magnetic induction method is a technique using a phenomenon in which, when two coils are adjacent to each other and a current flows to one of the two coils, generated magnetic flux causes an electromotive force in the other coil, and commercialization of the magnetic induction method is rapidly progressing in small devices such as mobile phones.

The magnetic induction method is capable of transmitting power of several hundred kilowatts (kW) at most and has high efficiency, but a maximum transmission distance is less than or equal to one centimeter (cm) so that the magnetic induction method has a disadvantage of needing to be generally adjacent to a charger or a floor.

The electromagnetic resonance method is characterized in that an electric field or a magnetic field is used instead of using electromagnetic waves, a current, or the like. Since the electromagnetic resonance method is hardly affected by an electromagnetic wave problem, it has an advantage of being safe for other electronic devices or a human body. On the other hand, the electromagnetic resonance method has a disadvantage of being utilizable only in limited distances and spaces and having somewhat low energy transfer efficiency.

A short-wave wireless power transmission method (simply referred to as an RF transmission method) utilizes the fact that energy can be directly transmitted and received in the form of a radio wave.

This technique is an RF wireless power transmission method using a rectenna. The rectenna is a compound word of an antenna and a rectifier and refers to an element which directly converts RF power into direct current power. That is, the RF method is a technique that converts an alternating current (AC) radio wave into a DC. Recently, as efficiency of the RF method is improved, research on commercialization has been actively carried out.

The wireless power transmission technology may be widely used not only for the mobile devices, but also for all industries, such as information technology, railroad, and home appliance industries.

When a conductor which is not a wireless power receiver, i.e., a foreign object (FO), is present in a wireless chargeable area, an electromagnetic signal transmitted from a wireless power transmitter is induced to the FO so that a temperature of the FO may rise. For example, the FO may include a coin, a clip, a pin, a ballpoint pen, and the like.

When the FO is present between the wireless power receiver and the wireless power transmitter, wireless charging efficiency is significantly degraded, and temperatures of the wireless power receiver and the wireless power transmitter may also rise due to a rise in ambient temperature of the FO.

When the FO located in a charging area is not removed, waste of power may be caused, and the wireless power transmitter and the wireless power receiver may also be damaged due to overheating.

Therefore, detecting the FO located in the charging area accurately is emerging as an important issue in the field of wireless charging technology.

According to a related art, a method of determining whether an FO is present on the basis of a threshold value determined based on a measured quality factor value and a reference quality factor value, and a method of determining whether an FO is present on a wireless power transmission path on the basis of a loss of the wireless power transmission path have been disclosed.

However, the above methods have a problem in that accuracy of FO detection (FOD) is degraded according to types of receivers and transmitters.

The problem of the quality factor-based FOD method defined in a current standard may be summarized with the following two factors.

1. Difficulty in calibration of a quality factor (a transition of quality factor values between designs) in consideration of a difference of each design of transmitting coils of a transmitter (each transmitter type)

2. Measurement accuracy of a quality Factor of a transmitter

In conjunction with the above problem #1, a conventional reference quality factor value is measured based on a standardized specific transmitting coil design (defined in the standard).

In a state in which a receiver is located at a charging interface and an FO is not present in the vicinity of the receiver, a reference quality factor in the standard may be defined as a quality factor of a primary coil having the specific transmitting coil design defined in the standard, wherein the quality factor of the primary coil is measured with respect to a specific operating frequency which may be, for example, 100 kHz.

However, in addition to the specific transmitting coil design defined in the standard, a transmitting coil of another design may be applied to a commercialized wireless power transmitter. Therefore, when the wireless power transmitter is designed, the reference quality factor value should be calibrated (or transited) by reflecting design features of different transmitting coils.

However, since each design of the transmitting coils has inherent inductance, inherent capacitance, and inherent resistance, initial quality factor values are different from each other, and values varied according to receivers are different from each other.

For example, in conjunction with the above problem #2, a quality factor of a transmitter may be measured as a voltage amplification ratio of a coil unit. However, since it is difficult to measure an amplified voltage as a stable value, an error of the quality factor value becomes very large.

In particular, since low reference quality factor values are measured in mobile phones or other electronic devices in which many friendly FOs (cases, batteries, and other circuits of the electronic device 30 including a receiver) are included, there is a problem in that it is difficult to accurately determine whether the FOs are present even when there is a small error.

DISCLOSURE

Technical Problem

The present invention is directed to providing a foreign object (FO) detecting method for wireless charging, a device therefor, and a system therefor.

The present invention is also directed to providing an FO detecting method capable of detecting an FO more accurately using a reference value corresponding to a type of transmitter, and a device therefor.

The present invention is also directed to providing an FO detecting method capable of exchanging transmission type information and dynamically calibrating a reference quality factor value using a reference value corresponding to the transmission type information so as to solve a problem that it is difficult to calibrate the reference quality factor value according to a characteristic difference for each design of transmitting coils or a predetermined reference value for determining an FO, and a device therefor.

The present invention is also directed to providing an FO detecting method capable of detecting an FO more accurately using a reference peak frequency value corresponding to a type of transmitter, and a device therefor.

The present invention is also directed to providing an FO detecting method using a reference peak frequency value so as to solve a problem that a measured quality factor value has a large error due to instability of an amplified voltage, and a device therefor.

The present invention is also directed to providing an FO detecting method capable of detecting an FO using an equivalent series resistance (ESR) which is calculated using a reference quality factor value and a reference peak frequency, which correspond to a type of transmitter, and using an equivalent series resistance (ESR) which is calculated using a measured quality factor value and a measured peak frequency.

The technical problems to be solved by the present invention are not limited to the above-mentioned technical problems and other technical problems which are not mentioned can be clearly understood by those skilled in the art to which the present invention pertains from the following description.

Technical Solution

The present invention may provide a foreign object (FO) detecting method and a device therefor.

One aspect of the present invention provides a method of detection an FO in a wireless power transmitter, which includes, when an object disposed in a charging area is detected, measuring a quality factor value within an operating frequency hand and searching for a measured peak frequency at which the quality factor value is the maximum, storing the measured peak frequency and a measured quality factor value corresponding to the measured peak frequency, transmitting information on a type of a transmitter to an identified wireless power receiver, receiving a reference quality factor value and a reference peak frequency which correspond to the type of the transmitter, calculating measured inductance using the measured peak frequency, calculating reference inductance using the reference peak frequency, and detecting an FO using at least one among the reference quality factor value, the reference peak frequency, and the reference inductance. In a negotiation phase, the reference quality factor value and the reference peak frequency may be received by being included in an FO detection (FOD) status packet.

The detecting of the FO may include calculating measured equivalent series resistance (ESR) using the inductance, the measured quality factor value, and the measured peak frequency, calculating reference ESR using the reference inductance, the reference quality factor value, and the reference peak frequency, and determining whether the FO is present using the measured ESR and the reference ESR.

The determining of whether the FO is present may include determining whether the FO is present by comparing the measured ESR with an ESR threshold value which is larger than the reference ESR by as much as a predetermined ratio.

The information on the type of the transmitter may be transmitted in an identification and configuration phase.

The information on the type of the transmitter may be transmitted according to a request of the identified wireless power receiver.

The measured peak frequency may be searched after power transmission is temporarily interrupted prior to entering a ping phase for identifying the wireless power receiver.

The reference peak frequency may be a frequency having a maximum quality factor value within the operating frequency band in a state in which the identified wireless power receiver is disposed in a charging area of a wireless power transmitter corresponding to the type of the transmitter.

The method may further include transmitting an ACK response or a NACK response to the wireless power receiver according to the detection result.

The method may further include outputting a predetermined warning alarm after the response is transmitted.

The FOD status packet may include mode information, and whether the reference peak frequency and the reference quality factor value are included in the FOD status packet may be identified on the basis of the mode information.

The detecting of the FO may include a first determination operation of determining whether the FO is present using the measured quality factor value and the reference quality factor value, a second determination operation of determining whether the FO is present using the measured inductance and the reference inductance, a third determination operation of determining whether the FO is present using the measured peak frequency and the reference peak frequency, a fourth determination operation of determining whether the FO is present using measured equivalent series resistance (ESR) calculated on the basis of the measured quality factor value, the measured inductance, and the measured peak frequency and using reference ESR calculated on the basis of the reference quality factor value, the reference inductance, and the reference peak frequency, and detecting the FO on the basis of determination results of the first determination operation to the fourth determination.

When it is determined that the FO is present in at least one among the first determination operation to the fourth determination operation, a final determination may be made that the FO is detected.

When it is determined that the FO is present in two or more among the first determination operation to the fourth determination operation, a final determination may be made that the FO is detected.

Another aspect of the present invention provides a foreign object (FO) detecting device for detecting an FO disposed in a charging area, which includes a measuring part configured to measure a quality factor value within an operating frequency band when an object is detected, a search part configured to search for a measured peak frequency at which the measured quality factor value is the maximum, a communication part configured to transmit information on a type of a transmitter and receive a reference quality factor value and a reference peak frequency which correspond to the type of the transmitter, a determiner configured to calculate reference inductance using the reference peak frequency, and a detector configured to detect an FO using at least one among the reference quality factor value, the reference inductance, and the reference peak frequency.

Still another aspect of the present invention provides a computer-readable recording medium on which a program for executing any one among the methods of detecting an FO is recorded may be provided.

The above aspects of the present invention are merely some of the exemplar embodiments of the present invention, and various embodiments to which the technical features of the present invention are reflected can be derived and understood by those skilled in the art on the basis of the detailed description of the present invention.

Advantageous Effects

Effects on a method, a device, and a system according to the present invention are described as follows.

The present invention has an advantage of providing a method of detecting a foreign object (FO) for wireless charging, a device therefor, and a system therefor.

Further, the present invention has an advantage of providing a method of detecting an FO, which is capable of detecting an FO more accurately, a device therefor, and a system therefor.

Further, the present invention has an advantage of providing a method of detecting an FO, which is capable of detecting an FO more accurately using a reference quality factor value and a reference peak frequency which correspond to a type of transmitter, and a device therefor.

Further, the present invention has an advantage of providing a method of detecting an FO, which is capable of detecting an FO more accurately using inductance calculated on the basis of a reference peak frequency corresponding to a type of transmitter, and a device therefor.

Further, the present invention has an advantage of providing a method of detecting an FO, which is capable of detecting an FO using an equivalent series resistance (ESR) calculated using a reference quality factor value and a reference peak frequency which correspond to a type of transmitter, and a measured quality factor value and a measured peak frequency, and a device therefor.

Further, the present invention has an advantage which is capable of detecting an FO irrespective of a type of wireless power transmitter in which a wireless power receiver is disposed.

The effects obtained by the present invention are not limited to the above-mentioned effects and other effects which are not mentioned can be clearly understood by those skilled in the art to which the present invention pertains from the following description.

DESCRIPTION OF DRAWINGS

FIG. 1 is a block diagram for describing a wireless charging system according to one embodiment of the present invention.

FIG. 2 is a block diagram for describing a wireless charging system according to another embodiment of the present invention.

FIG. 3 is a diagram for describing a detection signal transmission procedure in the wireless charging system according to one embodiment of the present invention.

FIG. 4 is a state transition diagram for describing a wireless power transmission procedure according to one embodiment of the present invention.

FIG. 5A is a flowchart for describing a foreign object detection (FOD) procedure in a negotiation phase according to one embodiment of the present indention.

FIG. 5B is a diagram for describing a message structure of a power transmitter design packet according to one embodiment of the present invention.

FIG. 5C is a flowchart for describing an FOD procedure in the wireless power transmission system according to one embodiment of the present invention.

FIG. 6 is a flowchart for describing an FOD procedure in a wireless power transmission system according to another embodiment of the present invention.

FIG. 7 is a flowchart for describing an FOD procedure in a wireless power transmission system according to still another embodiment of the present invention.

FIG. 8 is a diagram for describing a method of modulating and demodulating a wireless power signal according to one embodiment of the present invention.

FIG. 9 is a diagram for describing a packet format according to one embodiment of the present invention.

FIG. 10 is a diagram for describing types of packets according to one embodiment of the present invention.

FIG. 11 is a diagram for describing a structure of an FO detecting device according to one embodiment of the present invention.

FIG. 12 is a block diagram for describing a configuration of an FO detecting device according to another embodiment of the present invention.

FIG. 13 is a diagram for describing a message structure of an FOD status packet according to one embodiment of the present invention.

FIG. 14A is a diagram for describing a message structure of an FOD status packet according to another embodiment of the present invention.

FIG. 14B is a diagram for describing a message structure of an extended FOD status packet according to one embodiment of the present invention.

FIG. 15 is a block diagram for describing a configuration of a wireless charging system according to one embodiment of the present invention.

FIG. 16 is a diagram for describing a message structure of an FOD status packet according to still another embodiment of the present invention.

FIGS. 17A to 17I are diagrams for describing an FOD scenario according to one embodiment of the present invention.

FIG. 18 is a flowchart for describing an FOD procedure in a wireless power transmission system according to yet another embodiment of the present invention.

FIG. 19 is a flowchart illustrating an operation of determining whether an FO is detected according to one embodiment.

FIG. 20 is a table showing an FOD result using the FO detecting method according to one embodiment of the present invention.

BEST MODE OF THE INVENTION

One aspect of the present invention provides a method of detecting an FO in a wireless power transmitter, which includes, when an object disposed in a charging area is detected measuring a quality factor value within an operating frequency band and searching for a measured peak frequency at which the quality factor value is the maximum, storing the measured peak frequency and a measured quality factor value corresponding to the measured peak frequency, transmitting information on a type of a transmitter to an identified wireless power receiver, receiving a reference quality factor value and a reference peak frequency which correspond to the type of the transmitter, calculating measured inductance using the measured peak frequency, calculating reference inductance using the reference peak frequency, and detecting an FO using at least one among the reference quality factor value, the reference peak frequency, and the reference inductance.

[Modes of the Invention]

Hereinafter, various devices and methods to which embodiments of the present invention are applied will be described in more detail with reference to the accompanying drawings. Suffixes "module" and "part" for components used in the following description are given or interchanged in consideration of only ease of description, and thus these suffixes do not have distinctive meanings or functions.

Further, the suffixes "module" and "part" for components used in the following description may be implemented as hardware components including, for example, circuit elements, microprocessors, memories, sensors, and the like. However, this is merely an example and some functions or all functions of a corresponding component may be implemented in software.

In the description of the embodiment, when described as being formed "on (above) or under (below)" each component, the terms "on (above) or under (below)" include that two components are in direct contact with each other or one or more other components are formed to be disposed between the two components. Also, when described as being "on (above) or under (below)," the terms "on (above) or under (below)" may mean not only an upward direction but also a downward direction based on one component.

In the description of the embodiment, for convenience of description, a device equipped with a function of transmitting power in a wireless manner in a wireless charging system will be interchangeably used as a wireless power transmitter, a wireless power transmission device, a wireless power transmitting apparatus, a transmitting part, a transmitter, a transmission device, a transmitting side, and the like. Further, for convenience of description, a representation of a device equipped with a function of receiving power in a wireless manner from a wireless power transmitter will be interchangeably used as a wireless power receiving device, a wireless power receiver, a wireless power reception device, a wireless power receiver, a receiving terminal, a receiving side, a receiving device, a receiver, and the like.

The transmitter according to the present invention may be configured in a pad form, a cradle form, an access point (AP) form, a small base station form, a stand form, a ceiling buried form, a wall-mountable form, and the like. One transmitter may transmit power to a plurality of wireless power receiving devices. To this end, the transmitter may include at least one wireless power transmitting part. Herein, the wireless power transmitting part may employ various wireless power transmission standards based on an electromagnetic induction method of generating a magnetic field at a coil of a power transmitting end and performing charging using the principle of electromagnetic induction in which electricity is induced in a coil of a receiving end due to an influence of the generated magnetic field. For example, the wireless power transmission standard may include a standard technology of an electromagnetic induction method defined by a wireless power consortium (WPC) and a power matters alliance (PMA) which are wireless charging technology standard organizations, but the present invention is not limited thereto.

Further, the receiver according to one embodiment of the present invention may include at least one wireless power receiving part and may receive wireless power from one or more transmitters.

The receiver according to the present invention may be used in small electronic devices such as mobile phones, smart phones, laptop computers, digital broadcasting terminals, personal digital assistants (PDAs), portable multimedia players (PMPs), navigation devices, motion picture experts group (MP)-3 players, electric toothbrushes, electronic tags, lighting devices, remote controllers, fishing floats, wearable devices such as smart watches, and the like, but the present invention is not limited thereto, and the receiver may be used as long as a device can include the wireless power receiving part according to the present invention and a battery of the device can be charged.

FIG. 1 is a block diagram for describing a wireless charging system according to one embodiment of the present invention.

Referring to FIG. 1, the wireless charging system may include a wireless power transmitter 10 for transmitting power in a wireless manner, a wireless power receiver 20 for receiving the transmitted power, and an electronic device 30 for receiving the received power.

For example, the wireless power transmitter 10 and the wireless power receiver 20 may perform in-band communication in which information is exchanged using a frequency band equal to that of an operating frequency used for wireless power transmission.

In the in-band communication, when the wireless power receiver 20 receives a power signal 41 transmitted from the wireless power transmitter 10, the wireless power receiver 20 may modulate the received power signal and then transmit a modulated signal 42 to the wireless power transmitter 10.

Alternatively, the wireless power transmitter 10 and the wireless power receiver 20 may perform in-band communication in which information is exchanged using a frequency band different from that of an operating frequency used for wireless power transmission.

For example, the information exchanged between the wireless power transmitter 10 and the wireless power receiver 20 may include status information and control information on the wireless power transmitter 10 and the wireless power receiver 20. Here, the status information and the control information which are exchanged between the wireless power transmitter and the wireless power receiver will be more clear from the description of embodiments which will be described below.

The in-band communication and the out-of-band communication may provide bidirectional communication, but the present invention is not limited thereto. Alternatively, the in-band communication and the out-of-band communication may provide one-way communication or half-duplex communication.

For example, the one-way communication may be communication in which the wireless power receiver 20 transmits information to only the wireless power transmitter 10, but the present invention is not limited thereto. Alternatively, the one-way communication may be communication in which the wireless power transmitter 10 transmits information to only the wireless power receiver 20.

The half-duplex communication is characterized in that bidirectional communication between the wireless power receiver 20 and the wireless power transmitter 10 is possible, but it is only possible for one of the wireless power receiver 20 and the wireless power transmitter 10 to transmit information at any one time.

The wireless power receiver 20 according to one embodiment of the present invention may acquire various pieces of status information on the electronic device 30. For example, the status information on the electronic device 30 may include current power usage information, information for identifying an application being executed, central processing unit (CPU) usage information, battery charging status information, battery output voltage/current information, and the like, but the present invention is not limited thereto. The status information may be satisfied as long as information can be acquired from the electronic device 30 and utilized in power control.

FIG. 2 is a block diagram for describing a wireless charging system according to another embodiment of the present invention.

For example, as shown by a reference numeral 200a, the wireless power receiver 20 may include a plurality of wireless power receiving devices, and the plurality of wireless power receiving devices may be connected to one wireless power transmitter 10 to perform wireless charging.

In this case, the wireless power transmitter 10 may distribute and transmit power to the plurality of wireless power receiving devices in a time division manner, but the present invention is not limited thereto. Alternatively, the wireless power transmitter 10 may distribute and transmit power to the plurality of wireless power receiving devices using different frequency bands allocated thereto.

In this case, the number of the wireless power receiving devices connectable to one wireless power transmitter 10 may be adaptively determined on the basis of at least one among a required power amount for each wireless power receiving device, a charging status of a battery, power consumption of an electronic device, and available power of the wireless power transmission device.

Alternatively, as shown by a reference numeral 200b, the wireless power transmitter 10 may include a plurality of wireless power transmission devices. In this case, the wireless power receiver 20 may be simultaneously connected to the plurality of wireless power transmission devices and may simultaneously receive power from the connected wireless power transmission devices to perform charging. In this case, the number of wireless power transmission devices connected to the wireless power receiver 20 may be adaptively determined on the basis of a required power amount for the wireless power receiver 20, a charging status of a battery, power consumption of an electronic device, available power of the wireless power transmission devices, and the like.

FIG. 3 is a diagram for describing a detection signal transmission procedure in the wireless charging system according to one embodiment of the present invention.

For example, three transmitting coils 111, 112, and 113 may be installed in a wireless power transmitter. Some region of each transmitting coil may overlap the other transmitting coil, and the wireless power transmitter may sequentially transmit predetermined detection signals 117 and 127, for example, digital ping signals, to detect the presence of the wireless power receiver through each transmitting coil according to a predefined order.

As shown in FIG. 3, the wireless power transmitter may sequentially transmit the detection signals 117 through a primary detection signal transmission procedure indicated by a reference numeral 110 and identify the transmitting coils 111 and 112 receiving signal strength indicators 116 from a wireless power receiver 115. Subsequently, the wireless power transmitter may sequentially transmit the detection signals 127 through a secondary detection signal transmission procedure indicated by a reference numeral 120, identify a transmitting coil having high power transmission efficiency (or charging efficiency), i.e., having a high alignment status between the transmitting coil and the receiving coil, among the transmitting coils 111 and 112 receiving signal strength indicators 126, and control the identified transmitting coil to transmit power therethrough (i.e., to perform wireless charging).

As shown in FIG. 3, the reason why the wireless power transmitter performs the two detection signal transmission procedures is to more accurately identify which transmitting coil is well aligned with the receiving coil of the wireless power receiver. Alternatively, the detection signal transmission procedure may be performed only once (or only the primary detection signal transmission procedure may be performed).

As shown by the reference numerals 110 and 120 of FIG. 3, when the signal strength indicators 116 and 126 are received by a first transmitting coil 111 and a second transmitting coil 112, the wireless power transmitter selects a best-aligned transmitting coil on the basis of the signal strength indicators 126 received by the first transmitting coil 111 and the second transmitting coil 112 and performs wireless charging using the selected transmitting coil.

FIG. 4 is a state transition diagram for describing a wireless power transmission procedure.

Referring to FIG. 4, the power transmission from the transmitter to the receiver according to one embodiment of the present invention may be broadly divided into a selection phase 410, a ping phase 420, an identification and configuration phase 430, a negotiation phase 440, a calibration phase 450, a power transfer phase 460, and a renegotiation phase 470.

When a specific error or a specific event is detected while power transmission is started or maintained, the selection phase 410 may be transition operations, for example, including S402, S404, S408, S410, and S412. Here, the specific error and the specific event will be apparent from the following description.

Further, in the selection phase 410, the transmitter may monitor whether an object is present on an interface surface. When the object is detected as being placed on the interface surface, the transmitter may transit to the ping phase 420.

For example, in the selection phase 410, the transmitter may transmit an analog ping signal of a very short pulse and detect whether the object is present in an active area of the interface surface on the basis of a variation in current of a transmitting coil or a primary coil. Here, the active area may mean an area in which wireless charging is possible on the transmitter.

Alternatively, in the selection phase 410, the transmitter may detect whether an object is present in the active area of the interface surface using a sensor provided in the transmitter. For example, the sensor may include a Hall sensor, a pressure sensor, a capacitive sensor, a current sensor, a voltage sensor, a light detection sensor, and the like. At least one among the above sensors may be used to detect whether a conductive object is disposed in the active area.

When an object is detected, the transmitter may enter the ping phase 420 to wake the receiver up and transmit a digital ping for identifying whether the detected object is a wireless power receiver. In the ping phase 420, when a response signal with respect to the digital ping (e.g., a signal strength packet) is not received from the receiver, the transmitter may transit to the selection phase 410 again. Further, in the ping phase 420, when a signal indicating that power transmission is completed (i.e., a charging completion packet) is received from the receiver, the transmitter may transit to the selection phase 410.

When the ping phase 420 is completed, the transmitter may identify the receiver and transit to the identification and configuration phase 430 for collecting a configuration and status information of the receiver.

Further, in the identification and configuration phase 430, when an unexpected packet is received, when an expected packet is not received for a predefined time (a time out), when a packet transmission error occurs, or when no power transfer contract is established, the transmitter may transit to the selection phase 410.

The transmitter may determine whether entering the negotiation phase 440 is required on the basis of a negotiation field value of a configuration packet received in the identification and configuration phase 430.

The receiver may be classified into a baseline power profile and an extended power profile according to a receivable power level.

A receiver having an extended power profile may perform some of a foreign object detection (FOD) procedure (some functions of FOD extensions) prior to entering the power transfer phase. Meanwhile, a receiver having a baseline power profile cannot perform the FOD procedure prior to entering the power transfer phase.

As wireless power reception performance of the receiver is improved, high power reception is possible, and thus importance of a function of detecting an FO disposed in a charging area is increasing. The receiver may set the negotiation field as "1" to perform the FOD procedure prior to the power transfer phase and achieve improvement of FOD performance in the power transfer phase through the calibration phase which will described below.

When a configuration packet in which the negotiation field is set as "1" is received from the receiver, the transmitter transmits a normal response (ACK response) to the receiver such that the receiver may enter the negotiation phase.

When the transmitter and the receiver enter the negotiation phase according to the configuration packet and the normal response, the transmitter and the receiver may perform a predetermined FOD procedure.

In the negotiation phase, the receiver transmits an FOD status packet to the transmitter at least once.

The transmitter receiving the FOD status packet may determine whether an FO is present using at least one FOD method which will be described below.

The transmitter may transmit an ACK or NACK response to the receiver according to the determination result of whether the FO is present.

Alternatively, when information predefined in the FOD status packet is not received or an error occurs, the transmitter may transmit a non-defined (ND) response.

As the determination result of whether the FO is present, when the FO is not detected, the transmitter may transmit an ACK response.

Otherwise, when the FO is detected, the transmitter may transmit a NACK response.

For example, when the HACK response is received the receiver may limit a required power parameter itself so as to not require power exceeding 5 W for the transmitter. Alternatively, when the NACK response is received, the receiver may transmit a predetermined control message for requesting power interruption and negotiation interruption to the transmitter. When the NACK response is transmitted, the transmitter may return to the selection phase within a certain period of time regardless of additional communication from the receiver.

On the other hand, when the FO is not detected, the transmitter may complete the negotiation phase 440 for transmission power and enter the power transfer phase 460 via the calibration phase 450.

Specifically, when the FO is not detected, in the calibration phase 450, the transmitter may receive information on strength of the received power (hereinafter, for convenience of description, referred to as received power strength information) from the receiver.

For example, the transmitter may calculate power being leaked due to a friendly FO of the receiver (which may include a case, a battery, and other circuits of the electronic device 30 in which the receiver is included) by comparing strength of currently transmitted power with that of the received power.

Alternatively, the transmitter may calculate radiated power, which does not reach the receiver during the power transmission process, i.e., leakage power. The transmitter may more accurately detect an FO added to the charging area during the power transmission on the basis of the calculated leakage power.

Also alternatively, power losses in the receiver and the transmitter may be measured so as to determine the strength of the power transmitted from the transmitter. In the calibration phase 450, the transmitter may predict a power loss (i.e., a path loss) on the basis of a difference in strength between the transmitted power at the transmitter and the received power at the receiver.

In the power transfer phase 460, when an unexpected packet is received, when an expected packet is not received for a predefined time (a time out), when a power transfer contract violation occurs, or when charging is completed, the transmitter may enter the selection phase 410.

Further, in the power transfer phase 460, when it is necessary to reconfigure a power transfer contract according to a change in a transmitter status, the transmitter may transit to the renegotiation phase 470.

Further, when it is necessary to reconfigure the power transfer contract according to a received power status and the like, the transmitter may transit to the renegotiation phase 470. In this case, when a renegotiation is completed normally, the transmitter may return to the power transfer phase 460.

The power transfer contract may be set on the basis of status information and characteristic information of the transmitter and the receiver. For example, the status information of the transmitter may include information on maximum transmittable power, information on maximum acceptable number of receivers, and the like, and the status information of the receiver may include information on required power and the like.

A method of detecting an FO prior to entering the power transfer phase will be described with reference to the wireless power transmission procedure of FIG. 4.

When an object is detected in the selection phase 410, in order to determine whether a wireless power receiver is disposed in the charging area together with an FO, the transmitter according to one embodiment of the present invention may measure a quality factor and/or a peak frequency (at which the quality factor is the maximum) of a wireless power resonant circuit (e.g., a resonant coil and/or a resonant capacitor, or a transmitting coil unit). Here, a quality factor value may be measured prior to entering the ping phase 420. In this case, a low voltage which does not wake the wireless power receiver up may be used as a voltage (or power or a current) for the measurement. Further, the quality factor value may be measured by being sampled in a predetermined frequency unit within an operating frequency band used for the wireless power transmission.

Inductance and/or a series resistance component of a corresponding transmitting coil may be reduced according to a change of a surrounding environment. Consequently, a resonance frequency of the corresponding transmitting coil may be varied (shifted). That is, a peak frequency of a quality factor, which is a frequency at which a maximum quality factor value is measured within the operating frequency band, may be shifted on a frequency axis.

For example, since the wireless power receiver includes a magnetic shield (a shielding material) having high permeability, the high permeability may increase an inductance value measured in the transmitting coil. On the other hand, a metal type FO may reduce the inductance value.

Generally, in the case of an LC resonant circuit, a resonant frequency (f_resonant) is calculated as $$\frac{1}{2\pi\sqrt{LC}}.$$

When only the wireless power receiver is disposed in the charging area of the transmitter, that is, an FO is not present in the charging area, an L value is increased and thus the resonance frequency becomes smaller. That is, the resonant frequency is moved (shifted) to a left side on the frequency axis. This is because strength of a magnetic field is increased due to the high permeability of the shielding material of the receiver, and thus the L value is increased.

On the other hand, when the FO is disposed in the charging area together with the wireless power receiver of the transmitter, the L value is decreased so that the resonant frequency is increased. That is, the resonant frequency is moved (shifted) to a right side on the frequency axis.

The transmitter according to one embodiment of the present invention may identify a frequency value corresponding to a quality factor value having a maximum value among quality factor values measured within the operating frequency band and store the identified frequency value in a memory.

A transmitter according to another embodiment of the present invention may identify a frequency value having the largest value among input/output voltage amplification factors of a coil unit (or the resonant capacitor) within the operating frequency band and store the identified frequency value in a memory.

Hereinafter, a frequency having a maximum quality factor value within the operating frequency band or a frequency having a maximum voltage amplification factor will be referred to as a quality factor peak frequency or for convenience of description, simply referred to as a peak frequency.

A quality factor of the transmitting coil may be measured using various methods.

For example, a measurement circuit for measuring a quality factor of the transmitting coil may be driven by a sinusoidal voltage and may include a resonant coil and a resonant capacitor which are connected in series.

An inductance value of the resonant capacitor may be selected such that a resonant frequency of the wireless charging system should be in an appropriate range. For example, the resonant frequency may be 100 kHz, but the present invention is not limited thereto. The quality factor of the transmitting coil may be calculated as a ratio between a root mean square (RMS) voltage applied to a corresponding transmitting coil and an RMS voltage applied to a corresponding system at the resonance frequency.

When the wireless power receiver is disposed in the charging area of the wireless power transmitter, the resonant frequency may be varied due to a receiving coil assembly (or a secondary coil assembly) and friendly metal components. Here, the friendly metal components may mean metal parts which constitute an electronic device in which the wireless power receiver is installed or are attached to the electronic device as accessories.

The transmitter may sweep the operating frequency band to search a peak frequency having a highest ratio of the RMS voltage, i.e., a ratio of the RMS voltage of the system to the transmitting coil. In this case, the RMS voltage may be a voltage in an appropriate range. A quality factor of a corresponding transmitting coil may correspond to the highest ratio measured at the searched peak frequency.

In the negotiation phase 430, the transmitter may determine whether an FO is present on the basis of a reference value received from the receiver.

In the negotiation phase 430, a basic method of detecting an FO may include, by the transmitter, receiving a predetermined reference value from the receiver, adjusting a threshold value on the basis of the received reference value, determining whether an FO is present by comparing a value measured in advance with the threshold value, and transmitting an ACK or NACK response to the receiver according to the determination result of whether the FO is present.

Here, the reference value may be a reference quality factor value and/or a reference peak frequency, but the present invention is not limited thereto.

For example, the reference value may be compensated for (converted) according to a type of transmitting coil of a corresponding transmitter, but this is merely one example, and the value measured by the transmitter may be compensated for (converted) according to a type of reference transmitting coil.

However, a disadvantage of a method of detecting an FO, which uses a reference quality factor value measured in a conventional reference transmitting coil assembly, i.e., a transmitting coil assembly designed with a transmitting coil design defined in the standard, is as follows.

Generally, in designs of transmitters, transmitting coil assemblies may have different characteristic values in an inductance L, a capacitance C, a coil diameter D, and the like.

Since the quality factor value is affected by the characteristic value, the transmitters may have different initial quality factor values. The following Table 1 shows that the initial quality factor value measured by an LCR meter is different according to each type of transmitter. Referring to the following Table 1, since all of the transmitters have different initial quality factor values, it is very difficult to compensate for the initial quality factor values, but it may be an important problem to solve. Further, since an actual transmitter has measurement accuracy that is lower than that of the LCR meter with respect to the quality factor value, it is difficult to compensate for a measured value.

TABLE 1

| Transmitting coil | Quality factor value (no receiver) | Resonant frequency (no receiver) |
|---|---|---|
| Type 1 | 160.83 | 102.7 |
| Type 2 | 105.11 | 101.3 |
| Type 3 | 134.1 | 100.0 |
| Type 4 | 111.54 | 101.5 |
| Type 5 | 108.68 | 127.0 |
| Type 6 | 122.82 | 102.7 |
| Type 7 | 91.47 | 99.7 |

On the other hand, in designs of most transmitters as shown in Table 1, when no receiver is disposed in the charging area, the resonant frequencies are similar to each other. Since the resonant frequency is determined by an L value and a C value, the other characteristic values are not very relevant. A peak frequency for each type of transmitting coil is measured close enough to a reference operating frequency. Thus, in most transmitters, an initial quality factor value may be subsequently equal to a quality factor value measured at a frequency of 100 kHz which is the reference operating frequency. Therefore, even when a conversion (or compensation) between the measured value and the reference value is required, since an initial value for the compensation is constant, a method of detecting an FO using a peak frequency is much more reliable. A transmitter designer may consider only a change of a peak frequency value according to a design purpose of each transmitter.

When the transmitter designer would convert (compensate for) parameter values corresponding to a commercially available transmitter product into parameter values corresponding to a reference transmitter, a quality factor value of the commercially available transmitter product should be measured similar to a reference value for each receiver.

However, in designs of some commercially available transmitter products, quality factor values measured in the commercially available transmitter products for each type of receiver have a significant difference. Thus, there is a problem of making the compensation very difficult.

Actually, referring to the following Table 2, it can be seen that the quality factor values measured by the LCR meter according to a type of receiver for each type of transmitting coil have a significant difference.

However, in terms of a peak frequency, it can be seen that a difference of a peak frequency, which is measured by the LCR meter for each type of transmitting coil, for each type of receiver is very small. Referring to Table 2, it can be seen that the difference of the peak frequency for each type of transmitting coil is less than 5% (except for Type 5) or less than 5 kHz. The difference may be a numerical value within a range predictable by the transmitter designer.

TABLE 2

| Types of Tx coils | Q value (with phone: first receiver) (by LCR meter) | Q value (with phone: second receiver) (by LCR meter) | Resonant frequency with first receiver (by LCR meter) | Resonant frequency with second receiver (by LCR meter) |
|---|---|---|---|---|
| Type 1 | 43.04 | 46.87 | 87.2 | 91.7 |
| Type 2 | 37.9 (▼12%) | 33.37 (▼29%) | 88.7 (▲2%) | 94.5 (▲3%) |
| Type 3 | 58.05 (▲35%) | 54.32 (▲16%) | 88.2 (▲1 %) | 91.9 (▲0%) |
| Type 4 | 39 (▼9%) | 35.15 (▼25%) | 86.6 (▼1%) | 93.2 (▲2%) |
| Type 5 | 46.35 (▲8%) | 44.34 (▼5%) | 120.4 (▲38%) | 124.4 (▲36%) |
| Type 6 | 41.72 (▼3%) | 44.29 (▼6%) | 82.2 (▼6%) | 88.2 (▼4%) |
| Type 7 | 30.85 (▼28%) | 34.5 (▼26%) | 88.5 (▲1%) | 93.7 (▲2%) |

As described above, since the compensation (conversion) of the quality factor value is difficult, there is a problem in that accuracy of FOD is degraded. In order to solve the above problem, it may be preferable for the transmitter to use information on a reference peak frequency or for the transmitter to transmit transmitting coil type information to the receiver and use a reference value, which is received from the receiver, corresponding to the transmitting coil type information. Hereinafter, a method of detecting an FO using a reference peak frequency according to one embodiment of the present invention, and a method of detecting an FO using a reference value corresponding to type information on a corresponding transmitter and/or type information on a transmitting coil installed in the corresponding transmitter will be described in detail.

1. Method of Detecting an FO Using a Reference Peak Frequency

A reference peak frequency of a wireless power receiver may be defined as a peak frequency measured at a primary coil of a test wireless power transmitter #MP1 (i.e., a reference transmitter) in a state in which the wireless power receiver is disposed in a charging area without an FO around the charging area.

The arrangement of the wireless power receiver in the charging area of reference transmitter is as follows.

First, a receiving coil (secondary coil) of the wireless power receiver is aligned with a transmitting coil (primary coil) of the test wireless power transmitter #MP1. For example, the receiving coil of the wireless power receiver may be disposed at a center of the charging area.

The wireless power receiver may be moved without rotation by being shifted in a constant distance offset unit (e.g., +/−5 mm) along an X-axis and a Y-axis of the charging area, which may be a charging face or a charging bed.

Reference peak frequencies may be determined at a central position and four offset positions of the charging area, and the largest value among the reference peak frequencies may be selected (determined) as a reference peak frequency corresponding to the wireless power transmitter, in this case, a voltage applied to a coil of the test wireless power transmitter, that is, a primary coil voltage, may be in a range of 0.85±0.25 Vrms.

The wireless power receiver may report the reference peak frequency thereof to the wireless power transmitter using a predetermined packet, e.g., an FOD status packet. Here, the reference peak frequency may be reported with accuracy of 5 kHz or more.

Hereinafter, a method of detecting an FO using the reported reference peak frequency will be described in detail. That is, in the method of detecting an FO according to embodiments of the present invention, a variation in resonant frequency of a transmitting coil may be detected, and whether an FO is present may be determined according to the detection result.

Environmental changes around the transmitting coil typically cause a reduction in inductance of the transmitting coil. Consequently, the resonant frequency of the transmitting coil is increased. In this case, the resonance frequency may be measured as a peak frequency corresponding to a quality factor value.

The wireless power receiver may provide information on a reference peak frequency to the wireless power transmitter such that it is possible to determine whether the increase of the peak frequency measured at the wireless power transmitter is due to an FO. The reference peak frequency may be a peak frequency measured at the transmitting coil of the test wireless power transmitter #MP1 when only the wireless power receiver is disposed in the charging area without an FO around the charging area.

A method of detecting an FO on the basis of a variation in peak frequency according to one embodiment of the present invention may be implemented through the following four operations.

First, prior to starting power transmission, the wireless power transmitter measures a peak frequency of a transmitting coil. For example, prior to starting a digital ping so as to wake the wireless power receiver up, the wireless power transmitter may measure the peak frequency of the transmitting coil.

Second, the wireless power receiver may transmit a reference peak frequency value to the wireless power transmitter. For example, in the negotiation phase, the wireless power receiver may transmit a reference peak frequency value using the FOD status packet.

Third, the wireless power transmitter may determine an appropriate threshold value using the reference peak frequency value. In the negotiation phase, the wireless power transmitter may determine the appropriate threshold value. In this case, the wireless power transmitter may determine the threshold value in consideration of a design difference (that is, a characteristic difference) between the transmitting coil of the wireless power transmitter and the transmitting coil of the test wireless power transmitter.

Fourth, when a peak frequency value measured at the transmitting coil of the wireless power transmitter exceeds the threshold value, the wireless power transmitter may interrupt power transmission in the negotiation phase. That is, when the measured peak frequency value exceeds the threshold value, the wireless power transmitter may determine that an FO is present in the charging area.

Hereinafter, a method of detecting an FO according to another embodiment of the present invention using a reference value corresponding to type information on a transmitter and/or type information on a transmitting coil installed in the transmitter will be described in detail.

In a conventional method of detecting an FO, a transmitter has no information transmitted to a receiver for FOD prior to entering the power transfer phase.

Information required for FOD, which is provided from the wireless power transmitter according to one embodiment of the present invention to the receiver prior to entering the power transfer phase, may include at least one among transmitting coil type information, information on a resonant frequency of a transmitting coil assembly or a transmitting coil unit (primary coil unit), and information on a quality factor of the transmitting coil assembly or the transmitting coil unit (primary coil unit).

For example, when the receiver receives the transmitting coil type information from the transmitter, the receiver may read pre-stored reference values (e.g., a reference quality factor value, a reference peak frequency value, and the like) corresponding to a type of the transmitting coil from a memory provided therein to transmit the read reference values to the transmitter.

Consequently, the transmitter may receive the reference values thereof mapped to the type of transmitting coil. Thus, there is an advantage in that the transmitter does not need to separately compensate for the reference values.

For example, when the transmitter having a fourth type of transmitting coil receives a reference quality factor value corresponding to a first type from the receiver, the transmitter may calculate (or predict) a reference quality factor value of the fourth type on the basis of the reference quality factor value corresponding to the first type. In this case, the calculated (or predicted) reference quality factor value corresponding to the fourth type may be different from an actual reference quality factor value corresponding to the fourth type to deviate from a predetermined tolerance range. This may degrade accuracy of FOD. The method of detecting an FO through the exchange of the transmitting coil type information according to the present embodiment has an advantage of preventing the accuracy of the FOD from being degraded due to an error generated during compensation (conversion) of the reference values.

As described above, although the features and advantages of the present embodiment have been described with respect to the method of detecting an FO on the basis of the reference quality factor value, the same advantages and effects may be expected in the method of detecting an FO on the basis of the reference peak frequency value.

When the receiver receives information on the resonant frequency of the primary coil unit of the transmitter from the transmitter, a reference peak frequency value measured corresponding to the transmitter having a characteristic of the received resonant frequency may be transmitted to the transmitter. In this case, since the transmitter receives the reference peak frequency value corresponding to a type of transmitter, there is an advantage in that it is not necessary to separately perform a procedure of compensating for the reference peak frequency value.

As an example, in the negotiation phase, the transmitter may provide the transmitting coil type information or information on the resonant frequency to the receiver.

FIG. 5A is a flowchart for describing an FOD procedure in the negotiation phase according to one embodiment of the present invention.

Hereinafter, the FOD procedure in the negotiation phase will be described in detail with reference to FIGS. 5A and 5B.

Referring to FIG. 5A, when the negotiation phase is started, the wireless power receiver may request information on a design of a connected wireless power transmitter using a general request packet (S551). For example, the information on the design of the wireless power transmitter may include information for identifying a type of coil and the number of coils included in the transmitting coil assembly (or unit) installed in the transmitter.

For example, when the wireless power transmitter receives the general request packet requesting the information on the design of the wireless power transmitter, the wireless power transmitter may transmit a predetermined response packet (e.g., this may be a power transmitter design packet which will be described below), which includes a singular/plural type indicator for identifying whether a transmitting coil unit installed in the wireless power transmitter is comprised of a single coil or a plurality of coils, and a type of transmitting coil constituting the transmitting coil unit, to the wireless power receiver (S552).

FIG. 5B is a diagram for describing a structure of the power transmitter design packet according to one embodiment of the present invention.

Referring to FIG. 5B, a power transmitter design packet 560 may include a singular/plural type field 561 and a transmitting coil type field 562.

For example, the type of transmitting coil recorded in the transmitting coil type field 562 may be a reference design number or a power interface indicator for uniquely identifying a corresponding transmission coil, but the present invention is not limited thereto. The reference design number may mean a designated number of a coil design defined in the standard. The power interface indicator may mean an indicator which may be expressed as a common characteristic between transmission designs.

In an example of FIG. 5B, although the singular/plural type field 561 has been shown as two bits and the transmitting coil type field 562 has been shown as one byte, this is merely one example, and it is noted that the number of bits allocated to each field may be different according to a design by those skilled in the art.

For example, the number of bits of the singular/plural type field 561 may be determined corresponding to the number of transmitting coils which is maximally includible in the transmitting coil unit. Further, the transmitting coil type field 562 may be determined on the basis of the number of different types of transmitting coils defined in the standard.

Referring to FIG. 5A, when the power transmitter design packet is received, the wireless power receiver determines a reference value on the basis of information (e.g., which may be information on a type of transmitting coil) included in the power transmitter design packet (S553). Here, the reference value may include a frequency shift value or a reference peak frequency value, a reference quality factor value, and the like.

Reference value(s) corresponding to each type of transmitting coil (or transmitting coil unit) are stored in advance and maintained in an internal memory of the wireless power receiver. When the power transmitter design packet is received from the transmitter, the wireless power receiver may read reference values corresponding to the type of transmitting coil with reference to the memory.

In the above embodiment, although the reference value corresponding to each type of transmitting coil has been described as being stored and maintained in the memory, this is merely one example, and a wireless power receiver according to another embodiment may store and maintain reference values corresponding to each resonant frequency of the transmission coils in the memory. In this case, the wireless power transmitter may transmit a resonance frequency value corresponding to the installed transmitting coil to the wireless power receiver using a predetermined packet, e.g., the power transmitter design packet.

The wireless power receiver may transmit an FOD status packet including the determined reference value to the wireless power transmitter (S554).

The wireless power transmitter may perform a predetermined FOD procedure on the basis of the reference value included in the FOD status packet. The wireless power transmitter may transmit a normal response (ACK response) to the wireless power transmitter according to the result of the FOD procedure (S555).

When the normal response is received, the wireless power receiver may transmit a packet for requesting information on capability of the wireless power transmitter (e.g., through the general request packet) to the wireless power transmitter. The wireless power transmitter may transmit a packet including capability information on the wireless power transmitter (e.g., a power transmitter capability packet) to the wireless power receiver (S556).

In order to receive guaranteed power, the wireless power receiver may transmit a predetermined packet including a guaranteed power value (e.g., a specific request packet) to the wireless power transmitter. When the guaranteed power value requested by the wireless power receiver is providable, the wireless power transmitter may transmit the normal response to the wireless power receiver (S557).

The wireless power receiver may terminate the negotiation phase by transmitting a packet indicating completion of the negotiation phase (e.g., which may be transmitted through the specific request packet) to the wireless power transmitter.

FIG. 5C is a flowchart for describing the FOD procedure in the wireless power transmission system according to one embodiment of the present invention.

Referring to FIG. 5C, when an object is detected in the selection phase, prior to entering the ping phase, a wireless power transmitter 510 may measure a quality factor value at a predetermined reference operating frequency (S501). Here, the reference operating frequency at which the quality factor value is measured may be a resonant frequency, but the present invention is not limited thereto. The wireless power transmitter 510 may store the measured quality factor value in an internal memory (S502).

The wireless power transmitter 510 may enter the ping phase and perform the detection signal transmission procedure described with reference to FIG. 3 (S503).

When the wireless power receiver 520 is detected, the wireless power transmitter 510 may enter the identification and configuration phase and transmit information on a type of the wireless power transmitter 510 (Tx_Type) to the wireless power receiver 520 (S504).

The wireless power receiver 520 may read a reference quality factor value corresponding to the received type of the wireless power transmitter 510 from a corresponding memory (S505). For example, a table in which reference quality factor values for each type of transmitter are mapped (hereinafter, for convenience of description, referred to as a reference quality factor mapping table) may be maintained in the wireless power receiver 520.

Further, the reference quality factor mapping table stored in the wireless power receiver 520 may be updated. For example, the wireless power receiver 520 installed in an electronic device capable of performing a wired/wireless communication connection may acquire update information through the electronic device and automatically update the reference quality factor mapping table on the basis of the acquired update information.

The electronic device may be linked with a specific server through a wired/wireless communication network and receive update information on the reference quality factor mapping table from the specific server. A manufacturer or seller of a wireless power transmitter may register a reference quality factor value with respect to the wireless power transmitter in a server.

The wireless power receiver 520 may transmit the read reference quality factor value to the wireless power transmitter 510 (S506).

The wireless power transmitter 510 may determine a threshold value for FOD on the basis of the received reference quality factor value (S507). For example, the threshold value may be determined as a value that is smaller than the reference quality factor value by as much as a predetermined ratio.

The wireless power transmitter 510 may detect an FO by comparing the measured quality factor value with the determined threshold value (S508). Here, when the measured quality factor value is smaller than the threshold value, the wireless power transmitter 510 may determine that an FO is present in the charging area.

The wireless power transmitter 510 may transmit an ACK response or a NACK response to the wireless power receiver 520 according to the FOD result.

When the wireless power receiver 520 receives the NACK response from the wireless power transmitter 510, the wireless power receiver 520 may control power of a predetermined level or more not to be supplied to the electronic device (or battery/load) through an output terminal until the wireless power transmitter 510 interrupts power transmission completely. Here, 5 W may be a reference with respect to the power of the predetermined level or more, but the present invention is not limited thereto.

FIG. 6 is a flowchart for describing an FOD procedure in a wireless power transmission system according to another embodiment of the present invention.

Referring to FIG. 6, when an object is detected in the selection phase, prior to entering the ping phase, a wireless power transmitter 610 may measure a quality factor value and a peak frequency within an operating frequency band (S601). For example, the wireless power transmitter 610 may measure the quality factor value at a predetermined frequency interval within the operating frequency band and determine a frequency having a maximum quality factor value as the peak frequency. Here, the determined peak frequency (PF_measured) and the measured quality factor value (Q_measured) corresponding to the peak frequency may be stored in an internal memory of the wireless power transmitter 610.

In the negotiation phase, a wireless power receiver 620 may request information on a type of transmitter from the wireless power transmitter 610 (S602). For example, the wireless power receiver 620 may request the information on the type of transmitter (Tx_type) from the wireless power transmitter 610 using a general request packet, but this is merely one example and the present invention is not limited thereto.

The wireless power transmitter 610 may transmit information on a type thereof to the wireless power receiver 620. For example, the wireless power transmitter 610 may transmit the type of transmitter to the wireless power receiver 620 using a predetermined transmitter type packet, but this is merely one example and the present invention is not limited thereto.

The wireless power receiver 620 may extract a pre-stored reference quality factor value (Q_reference) and/or a reference peak frequency (PF_reference), which corresponds to the received type of transmitter, with reference to a pre-stored reference quality factor mapping table (S604).

Here, the reference peak frequency means a frequency at which a highest quality factor value is measured in the type of transmitter, and the reference quality factor value means a quality factor value measured at the reference peak frequency.

The wireless power receiver 620 may transmit information on the extracted reference quality factor value corresponding to the type of transmitter and/or the reference peak frequency to the wireless power transmitter 610 (S605). Here, the wireless power receiver 620 may transmit the information on the reference quality factor value and/or the reference peak frequency to the wireless power transmitter 610 using an FOD status packet.

The wireless power transmitter 610 may determine a quality factor threshold value and a peak frequency threshold value for FOD on the basis of the information included in the FOD status packet (S606). For example, the quality factor threshold value may be determined as a value that is smaller than the reference quality factor value by as much as a predetermined ratio, and the peak frequency threshold value may be determined as a value that is larger than the reference peak frequency value by as much as a predetermined ratio, but the present invention is not limited thereto, and the quality factor threshold value and the peak frequency threshold value may be determined differently according to a design of a designer. The predetermined ratio may be replaced with a predetermined error range value. For example, the predetermined error range value may be 5 kHz, but the present invention is not limited thereto.

The wireless power transmitter 610 may determine whether an FO is present by comparing the measured quality factor value (Q_measured) and the quality factor threshold value (S607) (hereinafter, referred to as a first determination).

The wireless power transmitter 610 may determine whether an FO is present by comparing the measured peak frequency and the peak frequency threshold value (S608) (hereinafter, referred to as a second determination).

Here, a performance order of the first determination and the second determination may be reversed. That is, the second determination may be performed and then the first determination may be performed.

As the determination result of at least one of the first determination and the second determination, when the FO is detected, the wireless power transmitter 610 may finally determine that the FO is detected (S609).

The wireless power transmitter 610 may transmit an ACK response or a NACK response to the wireless power receiver 620 according to the FOD result (S610).

When the wireless power receiver 620 receives the NACK response from the wireless power transmitter 610, the wireless power receiver 620 may control power of a predetermined level or more not to be supplied to the electronic device (or battery/load) through an output terminal until the wireless power transmitter 610 interrupts power transmission completely. Here, 5 W may be a reference with respect to the power of the predetermined level or more, but the present invention is not limited thereto.

FIG. 7 is a flowchart for describing an FOD procedure in a wireless power transmission system according to yet another embodiment of the present invention.

Referring to FIG. 7, when an object is detected in the selection phase, prior to entering the ping phase, a wireless power transmitter 710 may measure a quality factor value and a peak frequency within an operating frequency band (S701). The wireless power transmitter 710 may measure the quality factor value at a predetermined frequency interval within the operating frequency band and determine a frequency having a maximum quality factor value as the peak frequency.

The wireless power transmitter 710 may store the determined peak frequency (PF_measured) and the measured quality factor value Q_measured at the peak frequency in an internal memory (S702).

The wireless power transmitter 710 may enter the ping phase and perform the detection signal transmission procedure described with reference to FIG. 3 (S703).

When the wireless power receiver 720 is detected, the wireless power transmitter 710 may enter the identification and configuration phase, and, in the identification and configuration phase, the wireless power transmitter 710 may transmit information on a type thereof (Tx_Type) to the wireless power receiver 720 (S704).

For example, the wireless power transmitter 710 may transmit information on a type thereof to the wireless power receiver 720 using a predetermined transmitter type packet.

Alternatively, in the identification and configuration phase, the wireless power transmitter 710 may provide the information on the type thereof to the wireless power receiver 720 according to a request of the wireless power receiver 720.

The wireless power receiver 720 may read a reference quality factor value and a reference peak frequency which correspond to the received type of the wireless power transmitter 710 from a corresponding memory (S705).

For example, a reference quality factor mapping table in which reference quality factor values for each type of transmitter are mapped may be maintained in the wireless power receiver 720.

Further, the reference quality factor mapping table stored in the wireless power receiver 720 may be updated.

For example, the wireless power receiver 720 installed in an electronic device capable of performing a wired/wireless communication connection may acquire update information through the electronic device and automatically update the reference quality factor mapping table on the basis of the acquired update information.

The electronic device may be linked with a specific server through a wired/wireless communication network and receive update information on the reference quality factor mapping table from the specific server. A manufacturer or seller of a wireless power transmitter may register a reference quality factor value and a reference peak frequency with respect to the wireless power transmitter in a server.

The wireless power receiver 720 may transmit the reference quality factor value and the reference peak frequency to the wireless power transmitter 710 (S706). Here, the reference quality factor value and the reference peak frequency may be values measured in a state in which an FO is not disposed in a center of the charging area in the wireless power transmitter corresponding to the type of transmitter.

The wireless power transmitter 710 may calculate measured equivalent series resistance (ESR) (ESR_measured) using the previously stored measured peak frequency (PF_measured) and the measured quality factor value (Q_measured) (S707).

Here, the ESR is a series resistance component which is parasitic to a capacitor or the like in an RLC series circuit. Actual capacitors and inductors used in electrical circuits are not ideal components with only capacitance or inductance. However, when the actual capacitors and inductors are connected to resistors in series, they are considered very close to deal capacitors and inductors. The resistor is defined as ESR.

The wireless power transmitter 710 may calculate reference ESR (ESR_reference) using the received reference peak frequency (PF_reference) and the reference quality factor value (Q_reference) (S708).

The wireless power transmitter 710 may detect an FO using the ESR_measured and the ESR_reference (S709). For example, the wireless power transmitter 710 may determine whether the FO is present by comparing a ratio between the ESR_reference and the ESR_measured with a predetermined threshold value.

The wireless power transmitter 710 may transmit an ACK response or a NACK response to the wireless power receiver 720 according to the FOD result.

When the wireless power receiver 720 receives the NACK response from the wireless power transmitter 510, the wireless power receiver 720 may control power of a predetermined level or more not to be supplied to the electronic device (or battery/load) through an output terminal until the wireless power transmitter 710 interrupts power transmission completely. Here, 5 W may be a reference with respect to the power of the predetermined level or more, but the present invention is not limited thereto.

Hereinafter, a relationship between the ESR, the quality factor value Q, and the frequency will be described.

The quality factor value Q in an ideal RLC series circuit and a tuned radio frequency (TRF) receiver is calculated as follows.

$$Q = \sqrt{R\frac{L}{C}} = \frac{w_0 L}{R}$$

Here, R, L, and C denote storage, inductance, and capacitance, $W_0 = 2\pi f_0$, and $f_0$ means a resonant frequency.

Since $$f_0 = \frac{1}{2\pi\sqrt{LC}}, Q = \frac{1}{w_0 CR}$$

is obtained.

The ESR is always alternating current (AC) resistance measured at a standard frequency, and high ESR may increase aging heat generation, and a ripple current of a component.

The ESR may be calculated as $$ESR = \frac{1}{w_0 CQ}.$$

Thus, in the above embodiment, the ESR_reference may be calculated as $$\frac{1}{2\pi PF_{ref} CQ_{ref}},$$

and the ESR_measured may be calculated as $$\frac{1}{2\pi Pf_{measured} CQ_{measured}}.$$

$Q_{measured}$: a Q-factor measured by a wireless charger
$Pf_{measured}$: a peak frequency measured by the wireless charger
$Q_{ref}$: a reference Q-factor in a wireless charger type coil (in a state in which a receiver is disposed and an FO is not present)
$Pf_{ref}$: a reference peak frequency in the wireless charger type coil (in the state in which the receiver is disposed and the FO is not present)
c: capacitance of a resonant capacitor of the wireless charger In this case, the ratio between the ESR_reference and the ESR_measured may be calculated as follows.

$$\frac{ESR_{reference}}{ESR_{measured}} = \frac{\frac{1}{2\pi \cdot Pf_{ref} \cdot C \cdot Q_{ref}}}{\frac{1}{2\pi \cdot Pf_{measured} \cdot C \cdot Q_{measured}}} = \frac{Pf_{measured} \cdot Q_{measured}}{Pf_{ref} \cdot Q_{ref}}$$

$$\frac{ESR_{reference}}{ESR_{measured}} - 1 = \frac{Pf_{measured} \cdot Q_{measured}}{Pf_{ref} \cdot Q_{ref}} - 1$$

When the ratio between the ESR_reference and the ESR_measured exceeds a predefined ratio threshold value, the wireless power transmitter according to one embodiment may determine that the FO is present. Here, the ratio threshold value may be determined according to an experimental result. For example, when $$\frac{Pf_{measured} Q_{measured}}{Pf_{ref} Q_{ref}} - 1$$

is larger than 0.2, it may be determined that the FO is present.

FIG. 8 is a diagram for describing a method of modulating and demodulating a wireless power signal according to one embodiment of the present invention.

As shown by a reference numeral 810 of FIG. 8, the wireless power transmitter 10 and the wireless power receiver 20 may encode or decode a target transmission packet on the basis of internal clock signals having the same periods.

Hereinafter, a method of encoding a target transmission packet will be described in detail.

Referring to FIG. 1, when the wireless power transmitter 10 or the wireless power receiver 20 does not transmit a specific packet, as shown by a reference numeral 41 of FIG. 1, a wireless power signal may be an unmodulated AC signal having a specific frequency.

On the other hand, when the wireless power transmitter 10 or the wireless power receiver 20 transmits the specific packet, as shown by a reference numeral 42 of FIG. 1, the wireless power signal may be an AC signal modulated by a specific method. For example, a modulation method may include an amplitude modulation method, a frequency modulation method, a frequency and amplitude modulation method, a phase modulation method, and the like, but the present invention is not limited thereto.

As shown by a reference numeral 820, differential bi-phase encoding may be applied to binary data of a packet generated by the wireless power transmitter 10 or the wireless power receiver 20. Specifically, the differential bi-phase encoding performs two state transitions so as to encode a data bit "1" and performs one state transition so as to encode a data bit "0." That is, the data bit 1" tray be encoded such that a transition between a HI state and a LO state occurs at a rising edge and a falling edge of the clock signal, and the data bit "0" may be encoded such that a transition between the HI state and the LO state occurs at the rising edge of the clock signal.

As shown by a reference numeral 830, a byte encoding method may be applied to the encoded binary data. Referring to the reference numeral 830, the byte encoding method according to one embodiment may be a method of inserting a start bit and a stop bit so as to identify a start and a type of an 8-bit encoded binary bit stream and a parity bit so as to detect whether an error occurs in the 8-bit encoded binary bit stream (byte).

FIG. 9 is a diagram for describing a packet format according to one embodiment of the present invention.

Referring to FIG. 9, a packet format 900 used in information exchange between the wireless power transmitter 10 and the wireless power receiver 20 may include a preamble field 910 for acquiring synchronization for demodulation of a packet and identifying an accurate start bit of the packet, a header field 920 for identifying a type of message included in the packet, a message field 930 for transmitting contents (or a payload) of the packet, and a checksum field 940 for determining whether an error occurs in the packet.

A packet receiver may identify a size of the message field 930 included in the packet on the basis of a value of the header field 920.

Further, the header field 920 may be defined in each phase of the wireless power transfer procedure. Some values of header fields 920 may be defined to have the same value in different phases of the wireless power transfer procedure. For example, referring to FIG. 6 which will be described below, it should be noted that a header value corresponding to an end power transfer in the ping phase and a header value corresponding to an end power transfer in the power transfer phase may be equal to 0x02.

The message field 930 includes data which will be transmitted by a packet transmitter. For example, the data included in the message field 930 may be a report, a request, or a response with respect to a counterpart, but the present invention is not limited thereto.

A packet format 900 according to another embodiment of the present invention may further include at least one of transmitter identification information for identifying a transmitter which transmits a packet and receiver identification information for identifying a receiver which will receives the packet. Here, the transmitter identification information and the receiver identification information may include Internet protocol (IP) address information, media access control (MAC) address information, product identification information, and the like, but the present invention is not limited thereto and information, which is capable of distinguishing the receiver from the transmitter in the wireless charging system, is satisfied.

When a packet should be received by a plurality of devices, a packet format 900 according to still another embodiment of the present invention may further include predetermined group identification information for identifying a receiving group.

FIG. 10 is a diagram for describing types of packets according to one embodiment of the present invention.

Referring to FIG. 10, a table indicated by a reference numeral 1010 is a packet transmitted from the wireless power receiver to the wireless power transmitter, and a table indicated by a reference numeral 1020 is a packet transmitted from the wireless power transmitter to the wireless power receiver.

The packet transmitted from the wireless power receiver to the wireless power transmitter may include a signal strength packet for transmitting strength information on a detected ping signal, an end power transfer packet for requesting the wireless power transmitter to interrupt power transmission, a power control hold-off packet for transmitting information on a time spent waiting to adjust actual power after a control error packet for control is received, a configuration packet for transmitting configuration information on the wireless power receiver, an identification packet and an extended identification packet for transmitting receiver identification information, a general request packet for transmitting a general request message, a specific request packet for transmitting a special request message, an FOD status packet for transmitting a reference quality factor value and/or a reference peak frequency value for FOD, a control error packet for controlling transmission power of a wireless power transmitter which transmits an extended FOD status, a renegotiation packet for commencing renegotiation, a 24-bit received power packet and an 8-bit received power packet for transmitting strength information on received power, and a charging status packet for transmitting current charging status information on a load.

For example, the packet transmitted from the wireless power transmitter to the wireless power transmitter may include the power transmitter design packet for identifying a design of the wireless power transmitter.

Alternatively, a transmitter type packet may be additionally defined and used by the wireless power transmitter so as to transmit information on a type of wireless power transmitter.

The transmitter type packet, which is used by the wireless power transmitter to transmit the information on a type of wireless power transmitter, may be transmitted in the identification and configuration phase 430 or the negotiation phase 440 of FIG. 4 after establishing communication with the wireless power receiver.

Further, the power transmitter design packet, which is used to transmit information on a design characteristic of a transmitting coil unit in which the wireless power transmitter is installed, may be transmitted in the negotiation phase 440.

A predetermined identifier or an identification code, which is capable of identifying at least one among manufacturer information, model name information, and power class information of the wireless power transmitter, may be recorded in a message field of the transmitter type packet.

A message field of the power transmitter design packet may include at least one of information for identifying a type of coil used in the transmitting coil assembly or the transmitting coil unit installed in the wireless power transmitter (i.e., the transmitting coil type information) and information on the number of coils included in the transmitting coil unit. Here, the information on the number of coils may be information for identifying whether the number of coils is single or plural, but the present invention is not limited thereto.

The above-described packets may be transmitted using in-band communication using the same frequency band as that used in the wireless power transmission.

FIG. 11 is a diagram for describing a structure of an FO detecting device according to one embodiment of the present invention.

An FO detecting device, which will be described in the following embodiments, may be the wireless power transmitter or some components mounted therein.

Referring to FIG. 11, an FO detecting device 1100 may include a power supplier 1101, a direct current (DC)-DC converter 1110, an inverter 1120, a resonant circuit 1130, a measuring part 1140, a communication part 1160, a sensing part 1170, an alarm part 1175, and a controller 1180. The FO detecting device 1100 according to the present embodiment may be installed in a wireless power transmission device or a measuring device for authentication of a wireless power reception device.

The resonant circuit 1130 may include a resonant capacitor 1131 and an inductor (or transmitting coil) 1132, and the communication part 1160 may include at least one of a demodulator 1161 and a modulator 1162.

The power supplier 1101 may receive DC power from an external power terminal or a battery and transfer the DC power to the DC-DC converter 1110. Here, the battery may be installed in the FO detecting device 1100 and configured to be rechargeable, but this is merely one example, and the battery may be connected to the power supplier 1101 of the FO detecting device 1100 in the form of an auxiliary battery or an external battery through a predetermined cable.

The DC-DC converter 1110 may convert strength of the DC power input from the power supplier 1101 into specific strength of the DC power under the control of the controller 1180. For example, the DC-DC converter 1110 may be formed of a variable voltage regulator capable of adjusting a strength of a voltage, but the present invention is not limited thereto.

The inverter 1120 may convert the converted DC power into AC power. The inverter 1120 may convert an input DC power signal into an AC power signal and output the converted AC power signal through control of a plurality of switches provided in the inverter 1120.

For example, the inverter 1120 may include a full bridge circuit, but the present invention is not limited thereto. The inverter 1120 may include a half bridge circuit.

Alternatively, the inverter 1120 may include both a half bridge circuit and a full bridge circuit. In this case, the controller 1180 may adaptively determine whether to operate the inverter 1120 as the half bridge circuit or the full bridge circuit to control the inverter 1120.

The wireless power transmission device according to one embodiment of the present invention may adaptively control a bridge mode of the inverter 1120 according to a strength of power required by the wireless power reception device.

Here, the bridge mode includes a half bridge mode and a full bridge mode. For example, when the wireless power reception device requires low power of 5 W, the controller 1180 may control the inverter 1120 to be operated in the half bridge mode.

On the other hand, when the wireless power reception device requires power of 15 W, the controller 1180 may control the inverter 1120 to be operated in the full bridge mode. Alternatively, the wireless power transmission device may adaptively determine a bridge mode according to a detected temperature and drive the inverter 1120 according to the determined bridge mode.

For example, when a temperature of the wireless power transmission device exceeds a predetermined threshold while wireless power is transmitted through a half bridge mode, the controller 1180 may control the half bridge mode to be non-activated and a full bridge mode to be activated. That is, in order to transmit power of the same strength, the wireless power transmission device may increase a voltage through the full bridge circuit and decrease a strength of a current flowing in the resonant circuit 1130, thereby controlling an internal temperature of the wireless power transmission device to be maintained at a predetermined threshold or less.

Generally, an amount of heat generated from an electronic component installed in an electronic device may be more sensitive to strength of a current than strength of a voltage applied to the electronic component.

Further, the inverter 1120 may not only convert the DC power into the AC power but also change strength of the AC power.

For example, the inverter 1120 may adjust the strength of the output AC power by controlling a frequency of a reference AC signal used to generate the AC power under the control of the controller 1180. To this end, the inverter 1120 may include a frequency oscillator for generating a reference AC signal having a specific frequency, but this is merely one example. Alternatively, a frequency oscillator may be configured separately from the inverter 1120 and installed at one side of the FO detecting device 1100.

Alternatively, the FO detecting device 1100 may further include a gate driver (not shown) for controlling a switch provided in the inverter 1120. In this case, the gate driver may receive at least one pulse width modulated signal from the controller 1180 and control the switch of the inverter 1120 according to the received pulse width modulated signal. The controller 1180 may control a duty cycle (i.e., a duty rate) and a phase of the pulse width modulated signal to control strength of power output from the inverter 1120. The controller 1180 may adaptively control the duty cycle and the phase of the pulse width modulated signal on the basis of a feedback signal received from the wireless power reception device.

The measuring part 1140 may measure a voltage, a current, impedance, and the like across both ends of the resonant capacitor 1113 according to a control signal of the controller 1180, thereby calculating a quality factor value and an inductance value with respect to the resonant circuit 1130. In this case, the calculated quality factor value and the calculated inductance value may be transmitted to the controller 1180, and the controller 1180 may store the quality factor value and the inductance value which are received from the measuring part 1140 in a predetermined recording area.

The measuring part 1140 may measure a quality factor value corresponding to a predetermined reference operating frequency (hereinafter, for convenience of description, referred to as a measured reference quality factor value) and store the measured reference quality factor value in a predetermined recording area of a memory (not shown) provided in the measuring part 1140 under the control of the controller 1180.

Further, the measuring part 1140 may measure the quality factor value within the operating frequency band in a predetermined frequency unit under the control of the controller 1180 and transmit the measurement result to the controller 1180.

For example, when an object is detected in the selection phase, the controller 1180 may temporarily interrupt the power transmission and, prior to entering the ping phase, request the measuring part 1140 to measure quality factor values at a plurality of different frequencies within the operating frequency band. The controller 1180 may identify a frequency corresponding to the largest value among the measured quality factor values and determine the identified frequency as a measured peak frequency.

The controller 1180 may store the measured peak frequency and a quality factor value at the measured peak frequency (i.e., a measured quality factor value) in a memory (not shown).

When the FOD status packet is received from the modulator 1162 in the negotiation phase, the controller 1180 may determine a threshold value (or a threshold range) for determining whether an FO is present on the basis of information included in the FOD status packet (e.g., including a reference quality factor value and a reference peak frequency which correspond to a type of transmitter). Here, a method of determining the threshold value (or the threshold range) will become clearer through the above descriptions of the drawings.

The FOD status packet may include at least one of a reference quality factor value (Q_reference) and a reference peak frequency value (PF_reference) which correspond to the type of transmitter.

The controller 1180 may calculate a reference ESR (ESR_reference) using the received reference quality factor value and the received reference peak frequency.

Further, the controller 1180 may calculate a measured ESR (ESR_measured) using the measured quality factor value and the measured peak frequency.

The controller 1180 may determine whether an FO is present using the ESR_measured and the ESR_reference.

A detailed procedure and method of detecting, by the controller 1180, an FO using at least one of the reference quality factor value and the reference peak frequency which correspond to the type of transmitter are replaced with the descriptions of FIGS. 4 to 7.

FIG. 12 is a block diagram for describing a configuration of an FO detecting device according to another embodiment of the present invention.

Referring to FIG. 12, an FO detecting device 1200 may include a measuring part 1210, a search part 1220, a communication part 1230, a determiner 1240, a detector 1250, an alarm part 1260, a storage 1270, a transmitter 1280, and a controller 1290. The components of the FO detecting device 1200 are not necessarily essential, and some of the components may be added or omitted.

The transmitter 1280 may include a DC-DC converter, an inverter, a resonant circuit, and the like for wireless power transmission.

When an object disposed in the charging area is detected in the selection phase, the measuring part 1210 may temporarily interrupt power transmission and measure quality factor values. Here, the quality factor values may be measured at a plurality of frequencies determined within an available frequency band (or an operating frequency band). For example, the available frequency band may range from 88 kHz to 151 kHz, but this is merely one example, and the available frequency band may be different according to a design purpose of those skilled in the art and an applied wireless power transmission technology for standard).

The search part 1220 may search for a frequency having a maximum quality factor value (i.e., a measured peak frequency) on the basis of a measured result of the measuring part 1210. The measured peak frequency searched for by the search part 1220 and the quality factor value measured at the measured peak frequency (i.e., the measured quality factor value) may be stored in a predetermined recording area of the storage 1270.

When an FO is disposed in the charging area together with the wireless power receiver, there is a characteristic in that the peak frequency having the maximum quality factor value is increased as compared to when only the wireless power receiver is disposed in the charging area.

The communication part 1230 may demodulate a wireless signal to acquire various packets. For example, the communication part 1230 may acquire the signal strength packet in the ping phase.

Further, in the identification and configuration phase, the communication part 1230 may receive the identification packet and the configuration packet.

Further, in the negotiation phase, the communication pan 1230 may acquire the FOD status packet. Further, in the power transfer phase, the communication part 1230 may receive the control error packet, the received power packet, and the like for power control.

Further, the communication part 1230 may receive the transmitter type packet including a type of transmitter from the controller 1290 and transmit the transmitter type packet to the wireless power receiver. Further, when a packet requesting information on a type of transmitter is received from the wireless power receiver, the communication part 1230 may transfer the packet to the controller 1290.

For example, the FOD status packet may include at least one of a reference quality factor value (Q_reference) and a reference peak frequency value (PF_reference) which correspond to the type of transmitter.

A structure of the FOD status packet will become clearer through the following description of FIG. 13.

The determiner 1240 may determine an FOD threshold value using the reference quality factor value and the reference peak frequency which are included in the FOD status packet. Here, the FOD threshold value may include at least one among a quality factor threshold value, an inductance threshold value, a peak frequency threshold value, and an ESR threshold ratio.

Further, the determiner 1240 may calculate measured inductance using the measured peak frequency and calculate ESR using the measured inductance. Further, the determiner 1240 may calculate reference inductance using the reference peak frequency and calculate reference ESR using the reference inductance.

The detector 1250 may detect an FO disposed on a wireless power transmission path by comparing each of the measured quality factor value, the measured inductance, the measured peak frequency, and a ratio between the reference ESR and the measured ESR (or the measured ESR) with a corresponding threshold value.

For example, when the measured peak frequency is larger than the peak frequency threshold value, the detector 1250 may determine that an FO is present in the charging area.

Further, when the measured peak frequency is smaller than the quality factor threshold value, the detector 1250 may determine that the FO is present in the charging area.

Further, when the ratio between the reference ESR and the measured ESR is larger than the ESR threshold ratio, the detector 1250 may determine that the FO is present in the charging area.

Further, when the measured inductance is smaller than the inductance threshold value, the detector 1250 may determine that the FO is present in the charging area.

The controller 1290 may finally determine whether the FO is present on the basis of the FOD result of the detector 1250. The controller 1290 may transmit an ACK response, a NACK response, or a no decision (ND) response to the wireless power receiver according to the determination result with respect to whether the FO is present.

When the FO is determined as being present on the wireless power transmission path, the detector 1250 may interrupt power transmission and control the alarm part 1260 to output a predetermined warning alarm indicating that the FO is detected. For example, the alarm unit 1160 may include a beeper, a light emitting diode (LED) lamp, a vibrating element, a liquid crystal display, and the like, but the present invention is not limited thereto, and an alarm part may be sufficient as long as it can notify a user of detection of an FO.

FIG. 13 is a diagram for describing a structure of an FOD status packet message according to one embodiment of the present invention.

Referring to FIG. 13, an FOD status packet message 1300 may have a length of two bytes and include a first data field 1501 having a length of six bits, a mode field 1502 having a length of two hits, and a second data (reference quality factor value) field 1503 having a length of one byte.

For example, as shown by a reference numeral 1304, in the FOD status packet message 1300, when the mode field 1302 is set to a binary number of "00," all bits of the first data field 1301 may be written as zero, and information corresponding to a quality factor value which is measured and determined using a wireless power transmitter for authentication in a state in which power of the wireless power receiver is turned off may be recorded in the second data field 1303. Here, the quality factor value may be measured at a predetermined reference operating frequency. For example, the reference operating frequency may be 100 kHz, but the present invention is not limited thereto.

When the mode field 1302 is set to a binary number of "01," the reference peak frequency corresponding to the type of transmitter may be recorded in the first data field 1301, and the reference quality factor value corresponding to the type of transmitter may be recorded in the second data field 1303.

Here, the reference peak frequency value may mean a frequency having the largest quality factor value within the operating frequency band in a state in which only the wireless power receiver is disposed in the charging area of the wireless power transmitter corresponding to the type of transmitter. In particular, it should be noted that the reference peak frequency is not a peak frequency determined on the basis of the quality factor value measured at the wireless power transmitter for authentication.

FIG. 14A is a diagram for describing a structure of an FOD status packet message according to another embodiment of the present invention.

Referring to FIG. 14A, an FOD status packet message 1410 may have a length of two bytes and include a first data field 1411 having a length of six bits, a mode field 1412 having a length of two bits, and a second data field 1413 having a length of one byte.

For example, as shown by a reference numeral 1420, in the FOD status packet message 1410, when the mode field 1412 is set to a binary number of "00," all bits of the first data field 1411 may be written as zero, and information corresponding to a quality factor value which is measured and determined using a test wireless power transmitter for authentication in a state in which power of the wireless power receiver is turned off may be recorded in the second data field 1413. Here, the quality factor value may be measured at a predetermined reference operating frequency. For example, the reference operating frequency may be 100 kHz, but the present invention is not limited thereto.

The binary number of "01" which is a value of the mode field 1412 may be used by the receiver to inform the transmitter that information corresponding to a type of transmitting coil is not present in an internal memory of the receiver.

For example, when the information corresponding to the type of transmitting coil received from the transmitter is not present in the internal memory of the receiver, the receiver may transmit information corresponding to the wireless power transmitter for authentication (e.g., which may include a frequency shift value and a reference quality factor value which correspond to the wireless power transmitter for authentication) to the transmitter. In this case, the transmitter may convert the information corresponding to the wireless power transmitter for authentication into information corresponding to a type of transmitting coil of the transmitter. Thereafter, the transmitter may perform the FOD procedure using the converted information.

Referring to FIG. 14A, when the mode field 1412 is set to a binary number of "01," a frequency shift value corresponding to the wireless power transmitter for authentication may be recorded in the first data field 1411, and a reference quality factor value corresponding to the wireless power transmitter for authentication may be recorded in the second data field 1413. Here, the first data field 1411 and the second data field 1413 may be zero or a positive integer (unsigned integer). The frequency shift value may be a positive integer in a 1 kHz unit, but this is merely one example. Alternatively, the frequency shift value may have a predetermined resolution. For example, when a resolution of the frequency shift value is 0.2 kHz and the first data field 1411 is five, an actual frequency shift value may be 1 kHz (0.2 kHz*5). Similarly, the reference quality factor value may also have predetermined resolution.

The transmitter may determine a reference peak frequency value on the basis of the frequency shift value. Specifically, the reference peak frequency value may be determined by subtracting the frequency shift value from a reference operating frequency. For example, when the reference operating frequency of the wireless charging system is 100 kHz and the frequency shift value is 5 kHz, the reference peak frequency may be determined as 95 kHz.

As described above, a method of determining the reference peak frequency by subtracting the frequency shift value has effects which are capable of reducing a packet size and utilizing a space of the existing packet without additionally using a limited message header. Since the receiver essentially includes a shielding material, the reference peak frequency less than or equal to the reference operating frequency is measured when the receiver, except for the FO, is put on the charging area. Thus, as described above, even when the frequency shift value is subtracted, reference peak frequencies of all receivers may be expressed (indicated).

The binary number of "10" which is a value of the mode field 1412 may be used by the receiver to inform the transmitter that information corresponding to a type of transmitting coil is present in the internal memory of the receiver.

Further, the receiver transmits an FOD status packet, in which the mode field 1412 is set to the binary number "10," to the transmitter so that the receiver may control the transmitter to perform a procedure of calibrating (converting) a reference value for FOD on the basis of the information included in the FOD status packet of the transmitter and the type of transmitting coil thereof.

For example, when information corresponding to the type of transmitting coil is present in the internal memory of the receiver, the receiver may transmit the FOD status packet, in which the mode field 1412 is set to the binary number "10," to the transmitter.

Alternatively, the receiver may obtain the information on the type of transmitting coil from the transmitter by transmitting the FOD status packet in which the mode field 1412 is set to the binary number "10."

FIG. 14B is a diagram for describing a structure of an extended FOD status packet message according to one embodiment of the present invention.

Referring to FIG. 14B, an extended FOD status packet message 1430 may have a length of three bytes and include a reserved field 1431 having a length of six bits, a mode field 1432 having a length of two bits, a first data field 1433 having a length of one byte, and a second data field 1434 having a length of one byte. Here, both of the first data field 1433 and the second data field 1434 may have a positive integer.

As shown by a reference numeral 1440, when the mode field 1432 of the extended FOD status packet message 1430 is set to a binary number of "00," the reference quality factor value corresponding to the wireless power transmitter for authentication may be recorded in the first data field 1433, and the reference peak frequency value corresponding to the wireless power transmitter for authentication may be recorded in the second data field 1434. For example, when the information corresponding to the type of transmitting coil is not present in the internal memory of the receiver, the receiver may set the mode field 1432 of the extended FOD status packet message 1430 to a binary number "00" and transmit the information corresponding to the wireless power transmitter for authentication to the transmitter.

When the mode field 1432 of the extended FOD status packet message 1430 is set to a binary number of "01," the reference quality factor value corresponding to the type of transmitting coil may be recorded in the first data field 1433, and the reference peak frequency value corresponding to the type of transmitting coil may be recorded in the second data field 1434. For example, when the information corresponding to the type of transmitting coil is not present in the internal memory of the receiver, the receiver may set the mode field 1432 of the extended FOD status packet message 1430 to a binary n "01" and transmit information corresponding to the type of transmitting coil of the transmitter to the transmitter.

FIG. 15 is a block diagram for describing a wireless charging system according to one embodiment of the present invention.

Referring to FIG. 15, the wireless charging system may include a wireless power transmitter 1510 and a wireless power receiver 1520.

The wireless power transmitter 1510 may include a transmission controller 1511, a modulator 1512, a demodulator 1513, a converter 1514, a detector 1515, and a transmission circuit 1516.

The wireless power receiver 1520 may include a reception controller 1521, a modulator 1512, a demodulator 1513, a memory 1514, and a reception circuit 1525. The memory 1514 may maintain a predetermined reference value table in which reference value(s) for each type of transmitting coil (or a resonant frequency) are mapped.

The transmission controller 1511 of the wireless power transmitter 1510 may generate a power transmitter design packet including information on a type of transmitting coil in the negotiation phase and transmit the power transmitter design packet to the wireless power receiver 1520 through the modulator 1512.

The reception controller 1521 of the wireless power receiver 1520 may identify the type of transmitting coil of the wireless power transmitter 1510 connected to the wireless power receiver 1520 on the basis of the power transmitter design packet received through the demodulator 1522 and determine whether information corresponding to the identified type of transmitting coil is present reference to the memory 1514.

As the determination result, when the information corresponding to the type of transmitting coil is present, the reception controller 1621 may generate an FOD status packet or an extended FOD status packet including the information corresponding to the type of transmitting coil (e.g., a reference peak frequency value (or a frequency shift value) corresponding to the type of transmitting coil and a reference quality factor value corresponding to the type of transmitting coil) and transmit the generated FOD status packet or the generated extended FOD status packet to the wireless power transmitter 1510 through the modulator 1522.

On the other hand, as the determination result, when the information corresponding to the type of transmitting coil is not present, the reception controller 1521 may generate an FOD status packet or an extended FOD status packet including information corresponding to the wireless power transmitter for authentication (e.g., a reference peak frequency value (or a frequency shift value) corresponding to the wireless power transmitter for authentication and a reference quality factor value corresponding to the wireless power transmitter for authentication) and transmit the generated FOD status packet or the generated extended FOD status packet to the wireless power transmitter 1510 through the modulator 1622.

When the FOD status packet or the generated extended FOD status packet including the information corresponding to the type of transmitting coil is received through the demodulator 1513, the transmission controller 1511 may determine a threshold value (or a critical value) for FOD on the basis of the information corresponding to the type of transmitting coil.

Further, when the FOD status packet or the extended FOD status packet including the information corresponding to the wireless power transmitter for authentication is received through the demodulator 1513, the transmission controller 1511 may control the converter 1514 to generate information corresponding to a type of transmitting coil of the transmission controller 1511 on the basis of the information corresponding to the wireless power transmitter for authentication.

The transmission controller 1511 may determine the threshold value (or the critical value) for FOD on the basis of the information corresponding to the type of transmitting coil, which is generated by the converter 1514.

In the above-described embodiment of FIG. 15, although the wireless power transmitter has been described as transmitting the information on the type of transmitting coil to the wireless power receiver in the negotiation phase, this is merely one example, and the wireless power transmitter may transmit information on a resonant frequency corresponding to the installed transmission coil to the wireless power receiver.

Some of the components of the FO detecting device of FIG. 12, or some of the functions and operations of the components may be additionally provided or installed in the wireless power transmitter 1510 of FIG. 15.

FIG. 16 is a diagram for describing a structure of an FOD status packet message according to still another embodiment of the present invention.

Referring to FIG. 16, an FOD status packet message 1600 may have a length of two bytes and include a reserved field 1601 having a length of six bits, a mode field 1612 having a length of two bits, and a reference value field 1603 having a length of one byte.

For example, as shown by a reference numeral 1610, in the FOD status packet message 1600, when the mode field 1602 is set to a binary number of "00," a reference quality factor (reference quality factor value) may be recorded in the reference value field 1603, and, when the mode field 1602 is set to a binary number of "01," a reference peak frequency value may be recorded in the reference value field 1603.

Here, the reference quality factor value may be defined as a quality factor value measured at a reference operating frequency (e.g., 100 kHz, but the present invention is not limited thereto) predefined in a state in which power of the wireless power receiver is turned off and disposed in the charging area of the wireless power transmitter for authentication (e.g., this may be the #MP1 defined in the WPC standard).

Further, the reference peak frequency value may be defined as a resonance frequency value in a state in which power of the wireless power receiver is turned off and disposed in the charging area of the wireless power transmitter for authentication (e.g., this may be the #MP1 defined in the WPC standard). In this case, it should be noted that the reference peak frequency is measured in a state in which an FO is not disposed in the charging area of the wireless power transmitter for authentication.

The wireless power receiver according to one embodiment of the present invention may sequentially transmit FOD status packets having two different reference values at a regular interval during the negotiation phase according to a version of the wireless power receiver. Here, the two different reference values may mean the above-described reference quality factor value and the above-described reference peak frequency value.

For example, the version may include at least one among a software version, a protocol version, a standard version, and a hardware version, which are installed in the wireless power receiver.

The wireless power receiver according to one embodiment may set the mode field 1602 to the binary number "00" to transmit the reference quality factor value to the wireless power transmitter and then set the mode field 1602 to the binary number of "01" to transmit the reference peak frequency value to the wireless power transmitter, but this is merely one example. Alternatively, the reference peak frequency value may be transmitted and then the reference quality factor value may be transmitted.

The wireless power transmitter may detect the FO by comparing a reference value included in the received FOD status packet with a value measured by the transmitter. Specifically, the wireless power transmitter may determine a threshold value for FOD on the basis of the reference value included in the FOD status packet.

For example, the wireless power transmitter may determine a quality factor threshold value on the basis of the reference quality factor value and determine a peak frequency threshold value on the basis of the reference peak frequency value. The wireless power transmitter may determine whether an FO is present by comparing the determined threshold values with corresponding measured values.

The wireless power transmitter may transmit an ACK response or a NACK response to the wireless power receiver according to the FOD result.

Further, the wireless power transmitter may determine whether the field values included in the received FOD status packet are normal, and, when the received FOD status packet is not normal, the wireless power transmitter may transmit an ND response to the wireless power receiver. That is, when an appropriate response defined with respect to the received packet is not received, the wireless power transmitter may transmit the ND response to the wireless power receiver and ignore contents of the received packet.

As an example in which the received packet is not normal, there may be a case in which a value of the reserved field 1601 is not "000000" or a case in which a value of the mode field 1612 is not "00" or "01."

The FOD procedure according to the present embodiment may be completed prior to entering the power transfer phase.

When at least one NACK response is received as a response with respect to a plurality of FOD status packets, the wireless power receiver may control power of a predetermined reference value or more not to be supplied to an output terminal of the wireless power receiver until transmission of a power signal of the wireless power transmitter is interrupted. For example, the power of the predetermined reference value or more may be 5 W or more, but the present invention is not limited thereto. For example, when the NACK response is received, the wireless power receiver may not request power transmission of 5 W or more to the wireless power transmitter until the power signal is removed.

Further, when ND responses are received as responses with respect to all the plurality of FOD status packets, the wireless power receiver may control power of a predetermined reference value or more not to be supplied to the output terminal of the wireless power receiver until transmission of the power signal of the wireless power transmitter is interrupted.

When a normal FOD status packet is not received normally within a predetermined period of time after entering the negotiation phase, the wireless power transmitter may interrupt the transmission of the power signal and then enter the selection phase. In this case, when the power signal is no longer detected in the negotiation phase, the wireless power receiver may also release a connection to the wireless power transmitter and enter the selection phase.

FIGS. 17A to 17I are diagrams for describing an FOD scenario according to one embodiment of the present invention.

Hereinafter, various FOD scenarios using a plurality of FOD status packets will be described with reference to FIGS. 17A to 17I.

In the method of detecting an FO according to one embodiment of the present invention, FIGS. 17A to 17C are diagrams for describing a scenario of transition from the negotiation phase to the power transfer phase.

Referring to FIG. 17A, when entering the negotiation phase, the receiver may transmit a first FOD status packet to the transmitter. When the received first FOD status packet is normal, the transmitter may perform a first FOD procedure on the basis of the first FOD status packet. As the first FOD result, when an FO is not present, the transmitter may generate and transmit an ACK_response to the receiver.

The receiver may transmit a second FOD status packet to the transmitter. When the second FOD status packet is normal, the transmitter may perform a second FOD procedure on the basis of the second FOD status packet. As the second FOD result, when an FO is not present, the transmitter may generate and transmit an ACK response to the receiver.

When the ACK responses are received as responses with respect to all the FOD status packets, the receiver may enter the power transfer phase.

Referring to FIG. 17B, when entering the negotiation phase, the receiver may transmit a first FOD status packet to the transmitter. When the received first FOD status packet is not normal, the transmitter may generate and transmit an ND response to the receiver.

The receiver may transmit a second FOD status packet to the transmitter. When the received second FOD status packet is normal, the transmitter may perform an FOD procedure on the basis of the received second FOD status packet. As the FOD result, when an FO is not present, the transmitter may generate and transmit an ACK response to the receiver.

In this case, since at least one NACK response is not received or all ND responses are not received with respect to the first and second FOD status packets, the receiver may enter the power transfer phase.

Referring to FIG. 17C, when entering the negotiation phase, the receiver may transmit a first FOD status packet to the transmitter. When the received first FOD status packet is normal, the transmitter may perform a first FOD procedure on the basis of the first FOD status packet. As the first FOD result, when an FO is not present, the transmitter may generate and transmit an ACK response to the receiver.

The receiver may transmit a second FOD status packet to the transmitter. When the received second FOD status packet is not normal, the transmitter may generate and transmit an ND response to the receiver.

In this case, since at least one NACK response is not received or all ND responses are not received with respect to the first and second FOD status packets, the receiver may enter the power transfer phase.

In the method of detecting an FO according to one embodiment of the present invention, FIGS. 17D to 17I, which will be described below, are diagrams for describing a scenario that does not transit from the negotiation phase to the power transfer phase.

Referring to FIG. 17D, when entering the negotiation phase, the receiver may transmit a first FOD status packet to the transmitter. When the received first FOD status packet is normal, the transmitter may perform a first FOD procedure on the basis of the first FOD status packet. As the first FOD result, when an FO is present, the transmitter may generate and transmit a NACK response to the receiver.

The receiver may transmit a second FOD status packet to the transmitter. When the received second FOD status packet is normal, the transmitter may perform a second FOD procedure on the basis of the second FOD status packet. As the second FOD result, when an FO is not present, the transmitter may generate and transmit an ACK response to the receiver.

Since at least one NACK response is received as a response with respect to the plurality of FOD status packets, the receiver may not enter the power transfer phase and limit an output thereof to be less than or equal to a reference value until a power signal received from the transmitter is removed.

Alternatively, when the NACK response is received as a response with respect to the first FOD status packet, the receiver may not transmit the second FOD status packet. Since at least one NACK response is received, the receiver may not enter the power transfer phase and limit an output thereof to be less than or equal to the reference value until the power signal received from the transmitter is removed.

Limiting the output of the receiver to be less than or equal to the reference value may mean that the receiver does not request guaranteed power from the transmitter. Alternatively, the limiting may mean that the receiver does not attempt to receive power that is greater than or equal to 5 W from the transmitter. The limiting may be construed as the above meaning in the following description.

Referring to FIG. 17E, when entering the negotiation phase, the receiver may transmit a first FOD status packet to the transmitter. When the received first FOD status packet is normal, the transmitter may perform a first FOD procedure on the basis of the first FOD status packet. As the first FOD result, when an FO is not present, the transmitter may generate and trans ACK response to the receiver.

The receiver may transmit a second FOD status packet to the transmitter. When the received second FOD status packet is normal, the transmitter may perform a second FOD procedure on the basis of the second FOD status packet. As the second FOD result, when an FO is present, the transmitter may generate and transmit a NACK response to the receiver.

Since at least one NACK response is received among responses with respect to the plurality of FOD status packets, the receiver may not enter the power transfer phase and limit an output thereof to be less than or equal to a reference value until a power signal received from the transmitter is removed.

Referring to FIG. 17F, when entering the negotiation phase, the receiver may transmit a first FOD status packet to the transmitter. When the received first FOD status packet is normal, the transmitter may perform a first FOD procedure on the basis of the first FOD status packet. As the first FOD result, when an FO is present, the transmitter may generate and transmit a NACK response to the receiver.

The receiver may transmit a second FOD status packet to the transmitter. When the received second FOD status packet is normal, the transmitter may perform a second FOD procedure on the basis of the second FOD status packet. As the second FOD result, when an FO is present, the transmitter may generate and transmit a NACK response to the receiver.

Since at least one NACK response is received among responses with respect to the plurality of FOD status packets, the receiver may not enter the power transfer phase and limit an output thereof to be less than or equal to a reference value until a power signal received from the transmitter is removed.

Alternatively, when the NACK response is received as a response with respect to the first FOD status packet, the receiver may not transmit the second FOD status packet. Since at least one NACK response is received, the receiver may not enter the power transfer phase and limit an output thereof to be less than or equal to the reference value until the power signal received from the transmitter is removed.

Referring to FIG. 17G, when entering the negotiation phase, the receiver may transmit a first FOD status packet to the transmitter. When the received first FOD status packet is not normal, the transmitter may generate and transmit an ND response to the receiver.

The receiver may transmit a second FOD status packet to the transmitter. When the received second FOD status packet is not normal, the transmitter may generate and transmit an ND response to the receiver.

In this case, since only ND responses are received as responses with respect to all of the plurality of FOD status packets, the receiver may not enter the power transfer phase and limit an output thereof to be less than or equal to a reference value.

Referring to FIG. 17H, when entering the negotiation phase, the receiver may transmit a first FOD status packet to the transmitter. When the received first FOD status packet is normal, the transmitter may perform a first FOD procedure on the basis of the first FOD status packet. As the first FOD result, when an FO is present, the transmitter may generate and transmit a NACK response to the receiver.

The receiver may transmit a second FOD status packet to the transmitter. When the received second FOD status packet is not normal, the transmitter may generate and transmit an ND response to the receiver.

In this case, since at least one NACK response is received as a response with respect to the plurality of FOD status packets, the receiver may not enter the power transfer phase and limit an output thereof to be less than or equal to a reference value until a power signal received from the transmitter is removed.

Alternatively, when the NACK response is received as a response with respect to the first FOD status packet, the receiver may not transmit the second FOD status packet. Since at least one NACK response is received, the receiver may not enter the power transfer phase and limit an output thereof to be less than or equal to the reference value until the power signal received from the transmitter is removed.

Referring to FIG. 17I, when entering the negotiation phase, the receiver may transmit a first FOD status packet to the transmitter. When the received first FOD status packet is not normal, the transmitter may generate and transmit an ND response to the receiver.

The receiver may transmit a second FOD status packet to the transmitter. When the received second FOD status packet is normal, the transmitter may perform an FOD procedure on the basis of the second FOD status packet. As the FOD result, when an FO is present, the transmitter may generate and transmit a NACK response to the receiver.

In this case, since at least one NACK response is received as a response with respect to the plurality of FOD status packets, the receiver may not enter the power transfer phase and limit an output thereof to be less than or equal to a reference value until a power signal received from the transmitter is removed.

FIG. 18 is a flowchart for describing an FOD procedure in a wireless power transmission system according to yet another embodiment of the present invention. FIG. 19 is a flowchart illustrating an operation of determining whether an FO is detected according to one embodiment.

Referring to FIG. 18, when an object is detected in the selection phase, prior to entering the ping phase, a wireless power transmitter 1820 may measure a quality factor value and a peak frequency within an operating frequency band (S1801). The wireless power transmitter 1820 may measure the quality factor value at a predetermined frequency interval within the operating frequency band and determine a frequency having a maximum quality factor value as the peak frequency.

The wireless power transmitter 1820 may store the determined peak frequency (PF_measured) and the measured quality factor value (Q_measured) at the peak frequency in an internal memory (S1802).

The wireless power transmitter 1820 may enter the ping phase and perform digital ping signal transmission (S1803).

According to the embodiment shown in FIG. 18, when a wireless power receiver 1830 is detected, the wireless power transmitter 1820 enters the identification and configuration phase. The wireless power receiver 1830 may extract a pre-stored reference quality factor value (Q_reference) and/or a reference peak frequency (PF_reference) (S1806).

Here, the reference peak frequency means a frequency at which a highest quality factor value is measured in the type of transmitter, and the reference quality factor value means a quality factor value measured at the reference peak frequency. The wireless power receiver 1830 may transmit information on the reference quality factor value and/or the reference peak frequency to the wireless power transmitter 1820 (S1807). Here, the wireless power receiver 1830 may transmit the information on the reference quality factor value and/or the reference peak frequency to the wireless power transmitter 1820 using an FOD status packet.

The wireless power transmitter 1820 may calculate inductance using the measured peak frequency (PF_measured) and calculate ESR using the calculated inductance (S1808). Here, operation S1808 may be performed in the negotiation phase or performed in any one among the selection phase, the ping phase, and the identification and configuration phase after operation S1801.

Then, the wireless power transmitter 1820 may calculate reference inductance using the reference peak frequency (PF_reference) transmitted from the wireless power receiver 1830 and calculate reference ESR using the calculated reference inductance (S1809).

A peak frequency is sensitive to a distance (Z distance) between the transmitting coil and the receiving coil. For example, when a user puts a mobile phone on the wireless charger in a state of a mobile phone cover being put thereon (mobile phone case), the peak frequency may be measured higher than that measured when the mobile phone is not put on the mobile phone cover. Therefore, the peak frequency is measured to be larger than the reference peak frequency or measured to be larger than a threshold value calculated using the reference peak frequency, and thus the mobile phone may be misdetermined as an FO.

Accordingly, the wireless power transmitter 1820 may calculate additional information using the peak frequency and determine whether an FO is detected using the calculated additional information. For example, the additional information may be inductance or ESR.

The inductance and the ESR are orthogonal parameters, and this information may provide information on different characteristics for FOD. The inductance represents an imaginary number characteristic of impedance, and the ESR represents a real number characteristic of impedance.

Hereinafter, a method of calculating the inductance and the ESR using the peak frequency and/or the quality factor values will be described.

1. Calculation of Inductance

The measured peak frequency may be converted into inductance by Equation 1 below.

$$Lp' = \frac{1}{w^2 C_s} \quad \text{[Equation 1]}$$

The transmitting coil unit includes a resonant capacitor (e.g., the resonant capacitor 1113 of FIG. 11) connected to the transmitting coil. The resonant capacitor has a characteristic corresponding to a capacitance value $C_s$. The wireless power transmitter 1820 may calculate an inductance value of the transmitting coil unit using the measured peak frequency and a capacitance value of the resonant capacitor.

When the inductance value calculated as described above is used, an FO may be detected by utilizing the inductance corresponding to the characteristic of the transmitting coil unit.

The wireless power transmitter 1820 may calculate reference inductance corresponding to a characteristic of the transmitter using Equation 1 which uses the reference peak frequency received from the wireless power receiver 1830 for FOD.

When the reference inductance is directly received from the wireless power receiver 1830, since the reference inductance does not correspond to the characteristic of the transmitter due to a difference in transmitter design, there is a difference between a measured inductance value and a reference inductance value. However, since the peak frequency has a small difference for each transmitter design, a peak frequency measured by authentication equipment is very similar to that measured by the wireless power transmitter 1820. Therefore, when the reference inductance is calculated using the reference peak frequency received from the wireless power receiver 1830, it is possible to calculate inductance having a value with high accuracy and satisfying the characteristic of the transmitter.

When the wireless power receiver 1830 is disposed in the charging area, measured inductance is increased due to an influence of the shielding material included in the wireless power receiver 1830. On the other hand, when an FO is disposed in the charging area, the measured inductance is decreased. Therefore, the inductance value of the transmitting coil unit may be a criterion for determining whether an FO is detected. The wireless power transmitter 1820 may determine whether an FO is detected on the basis of the reference inductance and inductance (calculated using the measured peak frequency) of the transmitter coil unit.

2) ESR

The measured peak frequency, the measured quality factor value, and the measured inductance may be converted into an ESR value by Equation 2 below.

$$EST = \frac{wLp'}{Q} \quad \text{[Equation 2]}$$

Further, the reference peak frequency, the reference quality factor value, and the reference inductance may be converted into a reference ESR value by Equation 2.

When the ESR calculated as described above is used, an FO may be detected by utilizing the ESR value corresponding to the characteristic of the transmitting coil unit.

When the ESR value of the transmitting coil unit of the wireless power transmitter 1820 is compared with the ESR value when only a receiver is disposed in the charging region, the ESR values are not significantly different from each other. This is because the wireless power receiver 1830 simultaneously increases the quality factor value and the inductance.

However, when an FO is disposed in the charging region, since the inductance is decreased by a relatively small amount and the quality factor value is decreased by a relatively large amount, the ESR value is significantly increased.

The wireless power transmitter 1820 may determine whether an FO is detected on the basis of the calculated ESR and the reference ESR using the above-described characteristic.

Alternatively, the wireless power transmitter 1820 may store an ESR threshold value in an internal memory in consideration of only ESR when an FO is disposed without calculating the reference ESR and determine whether the FO is detected on the basis of the ESR threshold value.

The above-described ESR and the above-described reference ESR may have substantially the same physical meanings as those of the ESR_measured and the ESR_reference which are described in FIG. 7 and may be calculated in a similar manner. However, since the ESR and the reference ESR which are described in FIG. 7 are calculated on the basis of the inductance value and the reference inductance value instead of the capacitance value of the resonant capacitor, a variation in inductance due to an FO may be reflected so that it possible to determine more accurately whether the FO is detected.

In the method using the inductance and/or the ESR according to the above-described embodiment, the inductance and/or the ESR may replace the determination variables (the reference peak frequency and the measured peak frequency) of the method of determining an FO using the peak frequency, which is described reference to FIGS. 4 to 17I, and may be used as additional determination variables.

The wireless power transmitter 1820 may determine a quality factor threshold value, an inductance threshold value, a peak frequency threshold value, and an ESR threshold value for the FOD on the basis of the information included in the FOD status packet (S1810). For example, the quality factor threshold value may be determined as a value that is smaller than the reference quality factor value by as much as a predetermined ratio, and the inductance threshold value may be determined as a value that is smaller than the reference inductance value by as much as a predetermined ratio. Further, the peak frequency threshold value may be determined as a value that is larger than the reference peak frequency value by as much as a predetermined ratio, and the ESR threshold value may be determined as a value that is larger than the reference ESR value by as much as a predetermined ratio, but the present invention is not limited thereto, and the peak frequency threshold value and the ESR threshold value may be determined differently according to a design of a designer. The predetermined ratio may be replaced with a predetermined error range value. For example, the predetermined error range value with respect to the peak frequency may be 5 kHz, but the present invention is not limited thereto.

The wireless power transmitter 1820 may perform FOD determination using the pieces of information (the measured quality factor value, the calculated inductance value, the measured peak frequency value, and the calculated ESR value) and the threshold values (the quality factor threshold value, the inductance threshold value, the peak frequency threshold value, and the ESR threshold value) (S1811).

According to an example, a method of determining an FO using a plurality of pieces of information e.g., the inductance and the ESR) may be performed as shown in Table 3 below.

TABLE 3

|  | ESR_measured < ESR_th | ESR_measured > ESR_th |
| --- | --- | --- |
| Ls_measured < Ls_th | FO exists or Cover exists or error of measuring ESR(Q) -> Charger may allow to PW transfer. But, Charger should notice the possibility of FO presents | FO exists -> Stop Charging |
| Ls_measured > Ls_th | NO FO -> Go to calibration phase | FO exists (iron) or error of measuring ESR(Q) -> Charger may allow to PW transfer. But, Charger should notice the possibility of FO presents. |

Here, the method of determining an FO is performed according to a large or small relationship between the measured impedance Ls_measured) and the impedance threshold (Ls_th) and a large or small relationship between the measured ESR (ESR_measured) and the ESR threshold (ESR_th).

In a state in which two parameters are measured as characteristic values when an FO is present (:ESR_measured<ESR_th & Ls_measured<Ls_th), the wireless power transmitter interrupts power transmission (including a NACK response).

In a state in which the two parameters are measured as the characteristic values when the FO is not present (:ESR_measured<ESR_th & Ls_measured>Ls_th), the wireless power transmitter may continue the power transmission procedure (including an ACK response).

In a state in which both of the two parameters are not measured as the characteristic values when the FO is present (i.e., in a state in which one of the two parameters is measured as the characteristic value when the FO is not present) (:ESR_measured>ESR_th & Ls_measured>Ls_th or ESR_measured<ESR_th & Ls_measured<Ls_th), the wireless power transmitter may continue the power transmission procedure. However, since the FO is present the wireless power transmitter may limit power. For example, the wireless power transmitter may transmit only pre-negotiated minimum power. Alternatively, the wireless power receiver may notify a user of a probability for the presence of the FO (caution against FO) so that the user may check the charging area. Further, when a warning message indicating that the FO may be present is received, the wireless power receiver may not increase required power above the minimum power.

Referring to FIG. 19, an example (S1900) of the FOD determination is illustrated.

The wireless power transmitter 1820 may determine whether an FO is present by comparing the measured quality factor value (Q_measured) and the quality factor threshold value (S1910).

When the measured quality factor value is less than or equal to the quality factor threshold value, the wireless power transmitter 1820 may determine that the FO is detected (S1920).

When the measured quality factor value exceeds the quality factor threshold value, the wireless power transmitter 1820 may determine whether the FO is present by comparing the calculated inductance with the inductance threshold value (S1930).

When the calculated inductance (or the measured inductance) is less than or equal to the inductance threshold value, the wireless power transmitter 1820 may determine that the FO is detected (S1920).

When the calculated inductance exceeds the inductance threshold value, the wireless power transmitter 1820 may determine whether the FO is present by comparing the measured peak frequency with the peak frequency threshold value (S1940).

When the measured peak frequency is greater than or equal to the peak frequency threshold value, the wireless power transmitter 1820 may determine that the FO is detected (S1920).

When the measured peak frequency is less than the peak frequency threshold value, the wireless power transmitter 1820 may determine whether the FO is present by comparing the calculated ESR and the ESR threshold value (S1950).

When the calculated ESR (or the measured ESR) is greater than or equal to the ESR threshold value, the wireless power transmitter 1820 may determine that the FO is detected (S1920).

When the calculated ESR is less than the ESR threshold value, the wireless power transmitter 1820 may determine that the FO is not detected (S1960).

Here, an order of performing the determination corresponding to operations S1910, S1930, S1940, and S1950 may be changed according to the characteristic of the wireless power transmitter 1820. Further, at least some of the determination operations may be omitted according to the characteristic of the wireless power transmitter 1820.

The determination corresponding to operations S1910, S1930, S1940, and S1950 may be defined as a first determination operation, a second determination operation, a third determination operation, and a fourth determination operation, respectively.

In another example of the present invention, in order to determine whether an FO is present, the wireless power transmitter 1820 may use a combination of a plurality of parameters (at least two parameters among the quality factor, the peak frequency, the inductance, and the ESR). For example, when two or more parameters among four parameters satisfy a condition in which an FO is present, it may be determined that the FO is present. Consequently, it is possible to improve accuracy of the FOD by supplementing weak points of the FOD on the basis of the respective parameters.

Referring to FIG. 18 again, the wireless power transmitter 1820 may transmit an ACK response (a case following operation S1960) or a NACK response (a case following operation S1920) to the wireless power receiver 1830 according to the FOD result (S1812).

When the ACK response is received from the wireless power transmitter 1820, the wireless power transmitter 1820 and the wireless power receiver 1830 may continue a power negotiation procedure, and, when the power negotiation procedure is completed, the wireless power transmitter 1820 and the wireless power receiver 1830 may enter the calibration phase 450 or the power transfer phase 460.

When the wireless power receiver 1830 receives the NACK response from the wireless power transmitter 1820, the wireless power receiver 1830 may control power of a predetermined level or more not to be supplied to the electronic device (or battery/load) through an output terminal until the wireless power transmitter 1820 interrupts power transmission completely. Here, 5 W may be a reference with respect to the power of the predetermined level or more, but the present invention is not limited thereto.

FIG. 20 is a table showing an FOD result using the FO detecting method according to one embodiment of the present invention.

Referring to FIG. 20, a measured result for the determination of whether the FO is present utilizing the quality factor value, the peak frequency, the ESR, and the inductance is shown. For example, a method using four determination variables will be described, but it is also possible to determine using various other combinations.

The LCR meter may correspond to the reference values (the reference quality factor value, the reference peak frequency, the reference ESR, and the reference inductance), and the wireless power receiver 1830 corresponding to a specific receiver (mobile device 1 (MD1)) may receive or store reference values, which are measured or calculated, of a type-1 transmitting coil. As described above, in the negotiation process during the wireless charging process, the wireless power receiver 1830 may transmit the reference values to the wireless power transmitter 1820, or the wireless power transmitter 1820 may calculate the reference values on the basis of provided information.

Further, the wireless power transmitter 1820 may determine the threshold values (the quality factor threshold value, the peak frequency threshold value, the ESR threshold value, and the inductance threshold value) using the reference values.

Further, FIG. 20 shows a measured value and a calculated value of each determination variable with respect to various situations in which the specific receiver MD1 is located in a charging area of a transmitter (a type-4 transmitter) including a type-4 transmitting coil.

That is, FIG. 20 shows measured values and calculated values when only the receiver MD1 is disposed in the charging area, a height (Z-distance) is increased due to a cover (1 mm or 2 mm), an FO is put at a specific position (on a center of the charging area or spaced 10 mm from the center thereof) together with the receiver MD1, the height (Z-distance) is increased due to a cover (1 mm or 2 mm) in a state in which the FO is located at the center of the charging area, and the height (Z-distance) is increased due to a cover (1 mm or 2 mm) in a state in which the FO is located to be spaced 10 mm from the center of the charging area.

The wireless power transmitter may determine whether the FO is detected by comparing the measured values (or the calculated values) with the threshold values. As can be seen in FIG. 20, values corresponding to a condition in which the FO is present among the measured values and the calculated values are indicated by slashed lines. As described above, when the FO is present, it can be confirmed that two or more determination variables correspond to the condition in which the FO is present.

When the wireless power transmitter 1820 independently determines whether the FO is detected with respect to each determination variable and two or more among a plurality of determination variables (the quality factor, the peak frequency, the inductance, and the ESR) satisfy the condition in which the FO is present (when the measured quality factor value is less than or equal to the quality factor threshold value, the calculated inductance is less than or equal to the inductance threshold value, the measured peak frequency is greater than or equal to the peak frequency threshold value, and the calculated ESR greater than or equal to the ESR threshold value), it may be determined that the FO is present.

According to the present embodiment of the present invention, it may be determined that the FO is present only when the FO is actually present.

In contrast, when the height (Z-distance) of the receiver MD1 is increased due to the cover (2 mm), it may be determined that the FO is present as a result of determining whether the FO is detected on the basis of the determination variable of the peak frequency. Thus, even when the FO is not actually present, wireless power transmission is not performed such that there is a concern that quality of the wireless power transmission may be significantly degraded.

However, in accordance with the methods of detecting an FO according to the embodiments of the present invention, even in such a case, it is determined that the FO is not present so that the wireless power transmission may be continued and thus the quality of the wireless power transmission may be improved.

The methods according to the above-described embodiments may be produced as a program to be executed on a computer and stored in a computer-readable recording medium. Examples of the computer-readable recording medium include a read only memory (ROM), a random access memory (RAM), a compact disc ROM (CD-ROM), a magnetic tape, a floppy disk, an optical data storage device, and the like.

The computer-readable recording medium may also be distributed in a computer system connected via a network so that a computer-readable code may be stored and executed in a distributed manner. Further, functional programs, codes, and code segments for implementing the above-described methods may be easily deduced by programmers skilled in the art to which the embodiment pertain.

It will be obvious to those skilled in the art that the present invention may be embodied in other specific forms without departing from the spirit and essential features of the present invention.

Accordingly, the above detailed description should not be construed as limiting in any aspects and should be considered as illustrative. The scope of the present invention should be determined by reasonable interpretation of the appended claims, and all modifications within the equivalent scope of the present invention are included in the scope of the present invention.

INDUSTRIAL APPLICABILITY

The present invention relates to wireless charging and, particularly, can be applied to a wireless power transmitter equipped with a foreign object detection (FOD) function.

The invention claimed is:

1. A method of detecting a foreign object (FO) in a wireless power transmitter, comprising:
   calculating a measured value of a first parameter and a measured value of a second parameter on the basis of a quality factor value and a peak frequency in an operating frequency band; and
   proceeding with one state among a first state of interrupting power transmission, a second state of performing a power transmission procedure, and a third state of performing the power transmission procedure and notifying a wireless power receiver of a presence probability of an FO according to the measured value of the first parameter and the measured value of the second parameter.

2. The method of claim 1, wherein the first state includes a case in which both of the measured value of the first parameter and the measured value of the second parameter are characteristic values when the FO is present,
   wherein the second state includes a case in which both of the measured value of the first parameter and the measured value of the second parameter are characteristic values when the FO is not present, and
   wherein the third state includes a case in which one of the measured value of the first parameter and the measured value of the second parameter is a characteristic value when the FO is not present.

3. The method of claim 2, wherein transmission power in the third state is lower than transmission power in the second state.

4. The method of claim 3, wherein the transmission power in the third state is based on required power received from the wireless power receiver.

5. The method of claim 1, wherein the first parameter is inductance calculated using at least one of the quality factor value and the peak frequency, and
   wherein the second parameter is equivalent series resistance (ESR) calculated using at least one among the quality factor value, the peak frequency, and the inductance.

6. The method of claim 5, wherein, in the first state, the measured value of the first parameter is smaller than a reference value of the first parameter, and the measured value of the second parameter is larger than a reference value of the second parameter,
   wherein, in the second state, the measured value of the first parameter is larger than the reference value of the first parameter, and the measured value of the second parameter is smaller than the reference value of the second parameter, wherein the third state includes a third-first state or a third-second state, wherein, in the third-first state, the measured value of the first parameter is smaller than the reference value of the first parameter and the measured value of the second parameter is smaller than the reference value of the second parameter, and wherein, in the third-second state, the measured value of the first parameter is larger than the reference value of the first parameter and the measured value of the second parameter is larger than the reference value of the second parameter.

7. The method of claim 6, wherein the reference value of the first parameter and the reference value of the second parameter are calculated from at least one of a reference quality factor value and a reference peak frequency which are preset with respect to the wireless power transmitter.

8. The method of claim 7, wherein the reference quality factor value and the reference peak frequency are received from the wireless power receiver.

9. A method of detecting a foreign object (FO) in a wireless power transmitter, comprising:

calculating a measured value of a first parameter and a measured value of a second parameter on the basis of a measured quality factor value and a measured peak frequency in an operating frequency band;

calculating a reference value of the first parameter and a reference value of the second parameter on the basis of a reference quality factor value and a reference peak frequency in the operating frequency band;

selecting one among a first state in which an FO is present, a second state in which the FO is not present, and a third state in which there is a presence probability of the FO according to a comparison result between the measured value of the first parameter and the reference value of the first parameter and a comparison result between the measured value of the second parameter and the reference value of the second parameter; and performing a procedure according to a selected state among the first state, the second state, and the third state.

10. The method of claim 9, wherein the performing of the procedure includes:

interrupting power transmission in the first state;

performing a power transmission procedure in the second state; and performing the power transmission procedure and notifying a wireless power receiver of the presence possibility of the FO in the third state.

11. The method of claim 10, wherein, in the first state, both of the comparison result between the measured value of the first parameter and the reference value of the first parameter and the comparison result between the measured value of the second parameter and the reference value of the second parameter indicate that the FO is present, wherein, in the second state, both of the comparison result between the measured value of the first parameter and the reference value of the first parameter and the comparison result between the measured value of the second parameter and the reference value of the second parameter indicate that the FO is not present, and wherein, in the third state, one of the comparison result between the measured value of the first parameter and the reference value of the first parameter and the comparison result between the measured value of the second parameter and the reference value of the second parameter indicates that the FO is not present, and the other thereof indicates that the FO is present.

12. The method of claim 10, wherein the first parameter is inductance calculated using at least one of the quality factor value and the peak frequency, and wherein the second parameter is equivalent series resistance (ESR) calculated using at least one among the quality factor value, the peak frequency, and the inductance.

* * * * *